(12) United States Patent
Yoshida et al.

(10) Patent No.: US 6,777,792 B2
(45) Date of Patent: *Aug. 17, 2004

(54) SEMICONDUCTOR DEVICE AND PACKAGE WITH HIGH HEAT RADIATION EFFECT

(76) Inventors: Hiroshi Yoshida, c/o Sony Corporation, 7-35, Kitashinagawa 6-chome, Shinagawa-ku, Tokyo 141 (JP); Tsuyoshi Tojo, c/o Sony Corporation, 7-35, Kitashinagawa 6-chome, Shinagawa-ku, Tokyo 141 (JP); Masafumi Ozawa, c/o Sony Corporation, 7-35, Kitashinagawa 6-chome, Shinagawa-ku, Tokyo 141 (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/191,571

(22) Filed: Jul. 9, 2002

(65) Prior Publication Data

US 2002/0171135 A1 Nov. 21, 2002

Related U.S. Application Data

(62) Division of application No. 09/385,955, filed on Aug. 30, 1999, now Pat. No. 6,479,889.

(30) Foreign Application Priority Data

Sep. 4, 1998 (JP) .......................................... P10-251602
Nov. 25, 1998 (JP) .......................................... P10-334735

(51) Int. Cl.[7] .............................. H05K 7/12; H01S 3/02
(52) U.S. Cl. ...................... 257/678; 257/668; 257/777; 257/712; 257/713; 257/699; 257/730; 257/797; 257/675; 257/692; 257/693; 257/717; 257/686; 257/724; 257/728

(58) Field of Search .................................. 257/678, 668, 257/777, 712, 713, 699, 730, 797, 675, 692, 693, 717, 686, 724, 728

(56) References Cited

U.S. PATENT DOCUMENTS 3,601,667 A   8/1971   Desmond et al.
4,102,735 A   7/1978   Weglin (List continued on next page.)

FOREIGN PATENT DOCUMENTS

JP         63/067792      3/1988

*Primary Examiner*—Alexander Oscar Williams
(74) *Attorney, Agent, or Firm*—Sonnenschein Nath & Rosenthal LLP

(57) ABSTRACT

A conductive mounting board provided in a package has a recessed portion and a projecting portion, and an insulating mounting board is disposed on the recessed portion. The insulating mounting board is disposed on the recessed portion. The insulating mounting board has an insulating board on the surface of which a wiring portion is disposed. A semiconductor laser, constituted by stacked semiconductor layers each being made from a compound semiconductor composed of a group III based nitride, is disposed on the insulating mounting board and the conductive mounting board. An n-side electrode of the semiconductor laser is in contact with the insulating mounting board and a p-side electrode thereof is in contact with the conductive mounting board. Heat generated in the semiconductor laser is radiated via the conductive mounting board, and short-circuit between the n-side electrode and the p-side electrode is prevented by the insulating mounting board. In an alternative semiconductor device, the p-side electrode of the semiconductor element is fixed to the conductive mounting board and the n-side electrode thereof projects from the conductive mounting board.

12 Claims, 25 Drawing Sheets

U.S. PATENT DOCUMENTS

| | | |
|---|---|---|
| 4,546,478 A | 10/1985 | Shimizu et al. |
| 4,579,022 A | 4/1986 | Kasai et al. |
| 5,055,637 A | 10/1991 | Hagner |
| 5,194,017 A | 3/1993 | Consoli |
| 5,283,712 A | 2/1994 | Michihira et al. |
| 5,353,194 A | 10/1994 | Libretti et al. |
| 5,506,446 A | 4/1996 | Hoffman et al. |
| 5,661,339 A | 8/1997 | Clayton |
| 5,804,467 A | 9/1998 | Kawahara et al. |
| 5,957,705 A | 9/1999 | David et al. |
| 6,002,147 A | 12/1999 | Iovdalsky et al. |
| 6,018,193 A | 1/2000 | Rubens et al. |
| 6,040,624 A | 3/2000 | Chambers et al. |
| 6,043,557 A | 3/2000 | Phelps, Jr. et al. |
| 6,046,501 A | 4/2000 | Ishikawa et al. |
| 6,057,593 A | 5/2000 | Iovdalsky et al. |
| 6,135,782 A | 10/2000 | Cox et al. |
| 6,180,045 B1 | 1/2001 | Brandenburg et al. |
| 6,211,463 B1 | 4/2001 | Fabis |
| 6,225,695 B1 | 5/2001 | Chia et al. |
| 6,300,673 B1 | 10/2001 | Hoffman et al. |

F I G. 8
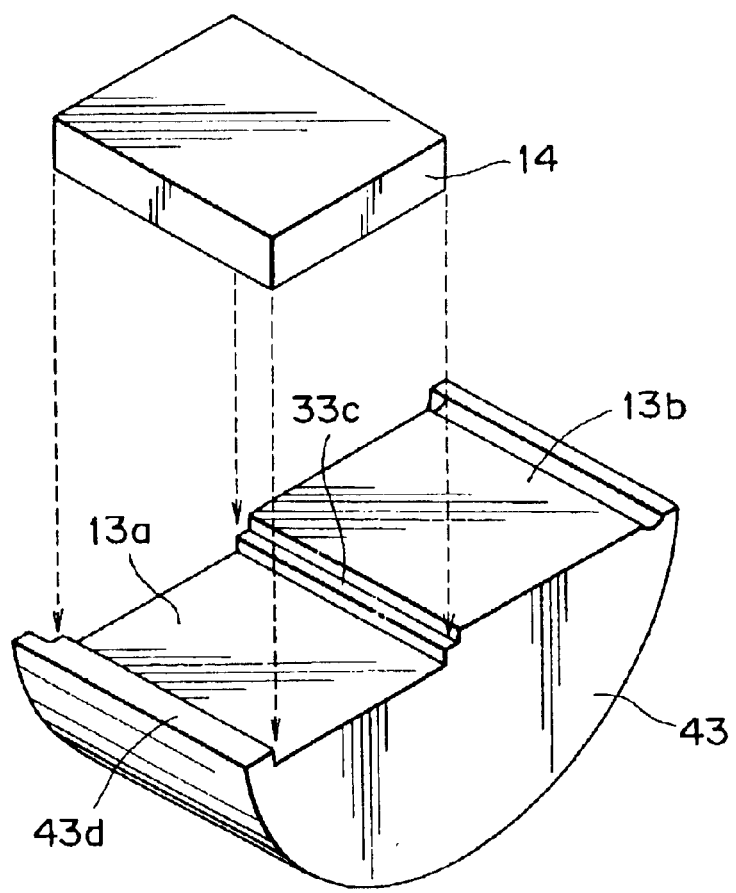

F I G. 9
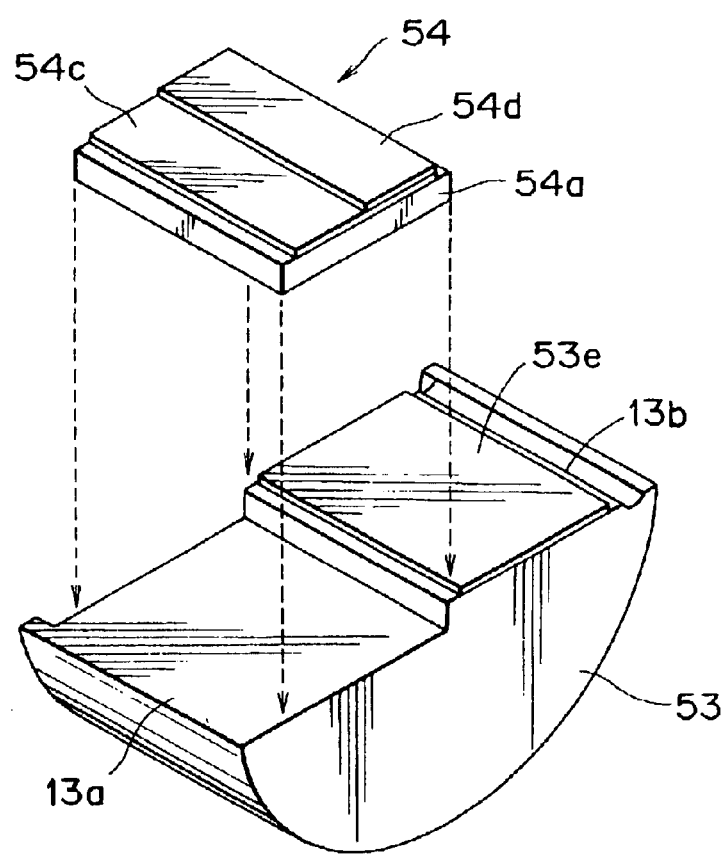

F I G. 11
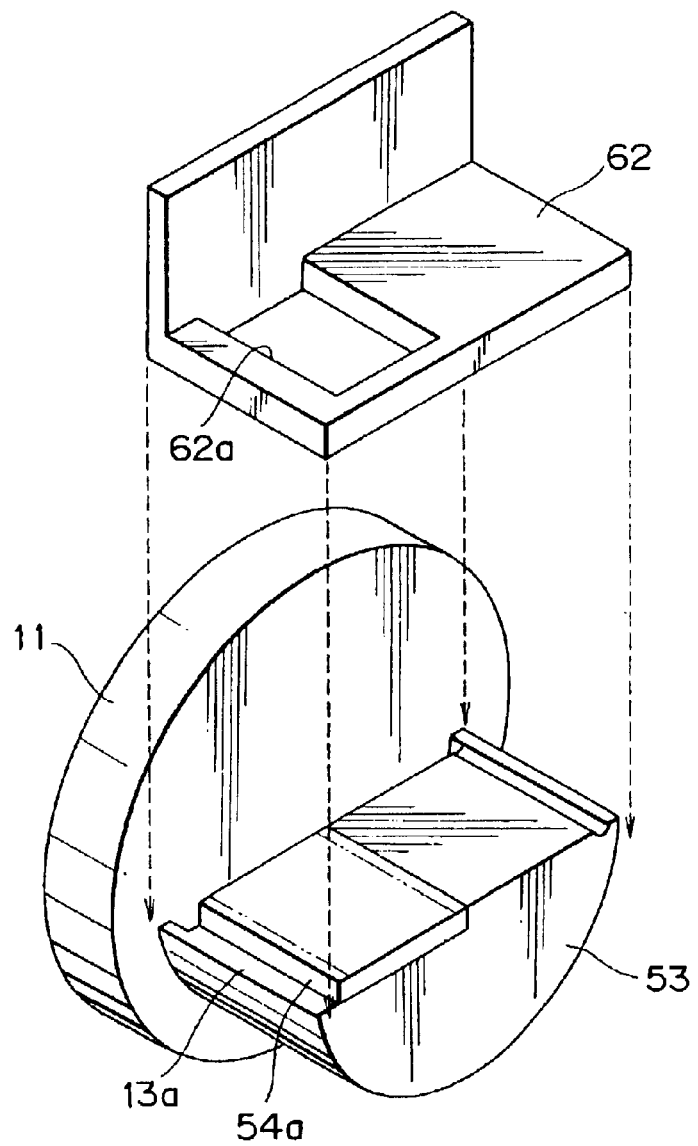

F I G. 25
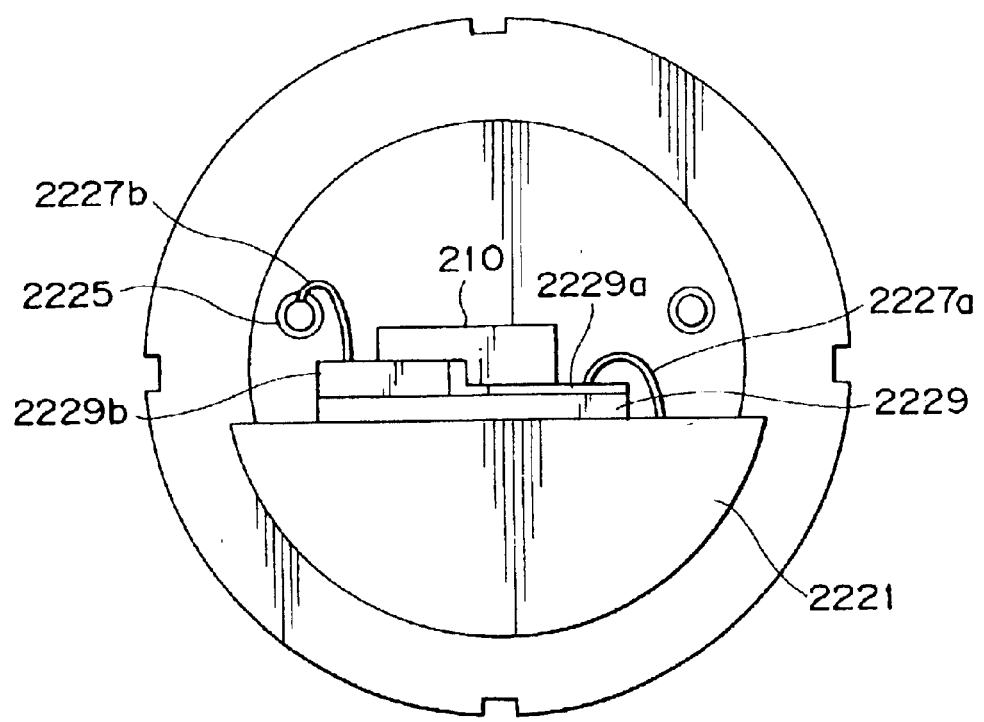

US 6,777,792 B2

SEMICONDUCTOR DEVICE AND PACKAGE WITH HIGH HEAT RADIATION EFFECT

RELATED APPLICATION DATA

This application is a divisional of application Ser. No. 09/385,955, filed Aug. 30, 1999, now U.S. Pat. No. 6,479,889 B1. The present and foregoing applications claim priority to Japanese Application No. P10-25 1602, filed on Sep. 4, 1998, and Japanese Application No. P10-334735, filed on Nov. 25, 1998. All of the foregoing applications are incorporated herein by reference to the extent permitted by law.

The present invention relates to a semiconductor device including a semiconductor element disposed on a mounting board and a package having the mounting board, and fabrication methods thereof.

At present, semiconductor light emitting devices are being used in various industrial fields. Such a semiconductor light emitting device is generally configured such that a semiconductor light emitting element is contained in a package. The package is adapted to achieve simple handling and protection of the light emitting element, and to efficiently radiate heat generated in the light emitting element upon operation of the light emitting device. In recent years, there have been strong demands to develop a high output semiconductor light emitting device, and to develop a semiconductor light emitting device for emission of green light using a compound semiconductor composed of a compound containing a group II element and a group V1 element or a semiconductor light emitting device for emission of blue color using a compound semiconductor composed of a nitride containing nitrogen and a group III element. To meet such demands, a power supplied to the light emitting element tends tc be increased, with a result that the amount of heat generation from the light emitting element becomes far larger. From this viewpoint, it is expected to enhance the heat radiation effect by means of the package for radiating the heat generation from the light emitting element.

FIG. 1 shows a related art semiconductor light emitting device having a configuration in which a semiconductor light emitting element 2220 is disposed via a sub-mount 2219 made from an insulator on a conductive mounting board 2213 made from a metal (see Japanese Patent Laid-open No. Hei8-321655). Such a semiconductor light emitting device is advantageous in that electrical connection to the semiconductor light emitting element can be easily performed by providing suitable wires on the sub-mount 2219. Specifically, the technique disclosed in this document is particularly effective for a semiconductor light emitting device in which a semiconductor light emitting element using a compound semiconductor composed of a nitride containing a group III element is formed on an insulating substrate and a p-side electrode and an n-side electrode are both provided on the side, opposed to the insulating substrate, of the light emitting element. Since the sub-mount 2219 is connected to the semiconductor light emitting element 2110, the p-side electrode and the n-side electrode may be connected to pins by way of the sub-mount 2219, to thereby make the area required for wire bonding large on the sub-mount 2219. A current can be injected into the semiconductor light emitting device from the p-side electrode and the n-side electrode connected to the two pins shown in FIG. 1 via the sub-mount 2219.

FIG. 2 shows another related art method for electrical connection of a semiconductor light emitting device including a semiconductor light emitting element using a compound semiconductor composed of a nitride containing a group III element. Referring to FIG. 2, a p-side electrode of the semiconductor light emitting device is connected to a left pin and an n-side electrode thereof is connected to a third pin (not shown) via a sub-mount 2129 and a conductive mounting board 2121. With this electrical connection, a current can be injected into the semiconductor light emitting device. Further, a photodetector (not shown) for monitoring optical output of the semiconductor light emitting device is disposed on the conductive mounting board 2121, wherein a first electrode of the photodetector is connected, together with the semiconductor light emitting device, to the common third pin not shown, and a second electrode of the photodetector is connected to a right pin. With this configuration, the optical output of the semiconductor light emitting device can be monitored by the photodetector.

The above-described technique, however, has a problem. Since an insulator is lower in both thermal conductivity and electrical conductivity than a metal, the p-side electrode and the n-side electrode provided on the same side are prevented from being short-circuited by using the insulating sub-mount 2219 or 2129, however, the heat radiation characteristic of the device is reduced. As a result, the temperature of the semiconductor light emitting element is raised, thereby degrading the stable operation and reliability of the device for a long-period of time.

A known semiconductor device of this type is configured such that a wiring portion is formed on a flat surface of a conductive board via a thin insulating film, and a p-side electrode of a semiconductor light emitting element is connected to the conductive board and an n-side electrode of the element is connected to the wiring portion. Such a semiconductor device, however, is disadvantageous in that since the wiring portion is formed on the conductive board via the thin insulating film, it is impossible to ensure the sufficient insulation of the wiring portion from the conductive board.

SUMMARY OF THE INVENTION

An object of the present invention is to provide a semiconductor device and a package, which are capable of ensuring a high heat radiation effect while preventing short-circuit between electrodes, and fabrication methods thereof.

To achieve the above object, according to a first aspect of the present invention, there is provided a semiconductor device including a conductive mounting board having a recessed portion and a projecting portion disposed on said conductive mounting board; an insulating mounting board disposed on said recessed portion of said conductive mounting board; and a semiconductor element having one portion disposed on said conductive mounting board and the other portion disposed on said insulating mounting board. With this configuration, it is possible to ensure electrical insulation of the semiconductor element and radiate heat generated in the semiconductor element via the conductive mounting board, and hence to suppress temperature rise of the semiconductor element and thereby ensure a stable operational state of the device for a long-period of time. As a result, it is possible to improve the reliability of the semiconductor device.

In this semiconductor device, preferably, the first electrode is disposed on a portion, on the side where the active layer is provided, of the first conduction type semiconductor layer and the second electrode is disposed on a portion, on the side opposed to the active layer, of the second conduction type semiconductor layer; and also the first electrode is disposed on the insulating mounting board and the second electrode is disposed on the conductive mounting board. With this configuration, it is possible to shorten the distance between the active layer and the conductive mounting board and hence to positively radiate heat generated in the active layer via the conductive mounting board. As a result, it is possible to suppress temperature rise of the semiconductor element and to prevent short-circuit between the first electrode and the second electrode of the semiconductor element.

In the semiconductor device, preferably, the semiconductor element is configured such that a plurality of the light emitting portions are formed on the same substrate. With this configuration, it is possible to radiate heat generated in each active layer via the conductive mounting board, and hence to suppress thermal interference between the light emitting portions. As a result, it is possible to suppress an increase in threshold current and a reduction in luminous efficiency in each light emitting portion, and hence to ensure a high quality of the device for a long-period of time.

In the semiconductor device, a separating portion is preferably provided on the conductive mounting board at a position between the recessed portion and the projecting portion. With this configuration, it is possible to more effectively ensure the insulation of the semiconductor element.

In the semiconductor device, a position fixing portion is preferably provided on the conductive mounting board in such a manner as to provide the recessed portion between the projecting portion and the position fixing portion. With this configuration, it is possible to easily and accurately dispose the insulating mounting board on the conductive mounting board.

In the semiconductor device, the insulating mounting board may be formed on the recessed portion of the conductive mounting board by deposition. With this configuration, it is possible to easily and accurately dispose the insulating mounting board at a low cost.

According to a second aspect of the present invention, there is provided a package including a conductive mounting board having on its one surface a recessed portion and a projecting portion; and an insulating mounting board disposed on the recessed portion of the conductive mounting board. With this configuration, it is possible to ensure electrical insulation of the semiconductor element by the presence of the insulating mounting board and to ensure the heat radiation characteristic by the presence of the conductive mounting board.

In this package, preferably, the conductive mounting board has the recessed portion on which the insulating mounting board is to be disposed and the projecting portion on which the semiconductor element is to be disposed. With this configuration, it is possible to ensure electrical insulation of the semiconductor element by the insulating mounting board disposed on the recessed portion and to positively radiate heat generated in the semiconductor element via the conductive mounting board.

According to a third aspect of the present invention, there is provided a method of fabricating a semiconductor device, including the steps of: forming a conductive mounting board having on its one surface a recessed portion and a projecting portion; forming an insulating mounting board disposed on the recessed portion of the conductive mounting board; forming a semiconductor element; and disposing one portion of the semiconductor element on the conductive mounting board and also disposing the other portion of the semiconductor element on the insulating mounting board. With this configuration, it is possible to easily fabricate the semiconductor device, and hence to easily realize the semiconductor device of the present invention.

According to a fourth aspect of the present invention, there is provided a method of fabricating a package including the steps of: forming a conductive mounting board having on its one surface a recessed portion and a projecting portion; and forming an insulating mounting board disposed on the recessed portion of the conductive mounting board.

With this configuration, it is possible to easily fabricate the package, and hence to easily realize the package of the present invention.

The method of fabricating the package, preferably, includes the step of: forming a conductive mounting board having on its one surface a recessed portion on which an insulating mounting board is to be disposed and a projecting portion on which a semiconductor element is to be disposed. With this configuration, it is possible to easily fabricate the package, and hence to easily realize the package of the present invention.

According to a fifth aspect of the present invention, there is provided a semiconductor device including: a semiconductor element having a plurality of stacked semiconductor layers and also having a first electrode and a second electrode provided on the same side in the stacking direction; and a conductive mounting board for supporting the semiconductor element in a state in which one of the first electrode and the second electrode of the semiconductor element is fixed to the conductive mounting board. With this configuration, it is possible to prevent short-circuit between the first electrode and the second electrode and to positively radiate heat generated in the semiconductor element via the conductive mounting board. This makes it possible to suppress temperature rise of the semiconductor element and to keep a stable operational state of the device for a long-period of time. As a result, it is possible to improve the reliability of the semiconductor device.

In this semiconductor device, preferably, the first electrode is provided on a portion, on the second conduction type semiconductor layer side, of the first conduction type semiconductor layer; and the second electrode is provided on a portion, on the side opposed to the first conduction type, of the second conduction type semiconductor layer and is also fixed to the conductive mounting board. With this configuration, it is possible to shorten the distance between the active layer and the conductive mounting board, and hence to more effectively radiate heat generated in the semiconductor element via the conductive mounting board.

In the semiconductor device, preferably, a side surface of the conductive mounting board is tilted, from the mounting surface side to the opposed side, toward one of the first electrode and the second electrode. With this configuration, it is possible to broaden a space near the other electrode, and hence to facilitate the electrical connection of the other electrode to a power source.

In the semiconductor device, preferably, the conductive mounting board is located to be shifted rightwardly from the center of the supporting surface when the mounting surface of the conductive mounting board is directed upwardly. With this configuration, it is possible to easily fix one of the first electrode and the second electrode to the conductive mounting board, and to easily connect the other electrode to a power source in accordance with Japanese Industrial Standards.

In the semiconductor device, preferably, the support has the fixing groove for fixing the conductive mounting board with the mounting surface directed downwardly. With this configuration, it is possible to facilitate the electrical connection of the other of the first electrode and the second electrode to a power source.

According to a sixth aspect of the present invention, there is provided a package including: a conductive mounting board having a mounting surface on which a semiconductor element is to be disposed; and a support, having a supporting surface perpendicular to the mounting surface, for supporting the conductive mounting board by the supporting surface; wherein the conductive mounting board is located in such a manner as to be shifted rightwardly or leftwardly from the center of the supporting surface when the mounting surface is directed upwardly; and the conductive mounting board has a side surface at an end, near the center of the support, in the direction parallel to the mounting surface and the supporting surface, the side surface being tilted, from the mounting surface side to the opposed side, toward the opposed end of the mounting surface. With this configuration, in the case of mounting the semiconductor element having the first electrode and the second electrode on the same side, one of the first electrode and the second electrode can be easily fixed to the conductive mounting board. This makes it possible to prevent short-circuit of the semiconductor element and to positively radiate heat generated in the semiconductor element via the conductive mounting board. Further, it is possible to broaden a space near the other electrode, and hence to facilitate the electrical connection of the other electrode to a power source.

According to a seventh aspect of the present invention, there is provided a method of fabricating a semiconductor device, including the steps of: stacking a plurality of semiconductor layers and providing a first electrode and a second electrode on the same side in the stacking direction, to form a semiconductor element; and disposing the semiconductor element on the conductor mounting board while fixing one of the first electrode and the second electrode on the conductive mounting board. With this configuration, it is possible to easily fabricate the semiconductor device of the present invention, and hence to easily realize the semiconductor device of the present invention.

In the above fabrication method, preferably, the semiconductor element is located on the lower side and the conductive mounting board is located on the upper side and in such a state the other electrode is connected to a pin by means of the wire. With this configuration, it is possible to facilitate electrical connection of the wire, and hence facilitate the electrical connection of the other electrode to a power source.

BRIEF DESCRIPTION OF THE DRAWINGS

FIG. 8 is an exploded perspective view of a portion of a semiconductor light emitting device according to a third embodiment of the present invention;

FIG. 9 is an exploded perspective view of a portion of a semiconductor light emitting device according to a fourth embodiment of the present invention;

FIG. 11 is a perspective view showing a fabrication step subsequent to that shown in FIG. 10;

FIG. 25 is a front view showing a configuration of a comparative example of the semiconductor device shown in FIG. 18.

DETAILED DESCRIPTION OF THE PREFERRED EMBODIMENTS

Hereinafter, embodiments of the present invention will be described in detail with reference to the drawings. It should be noted that in the following embodiments, a package combined with a semiconductor device of the present invention will be described simultaneously with description of the semiconductor device.

(First Embodiment)

Figure 1:
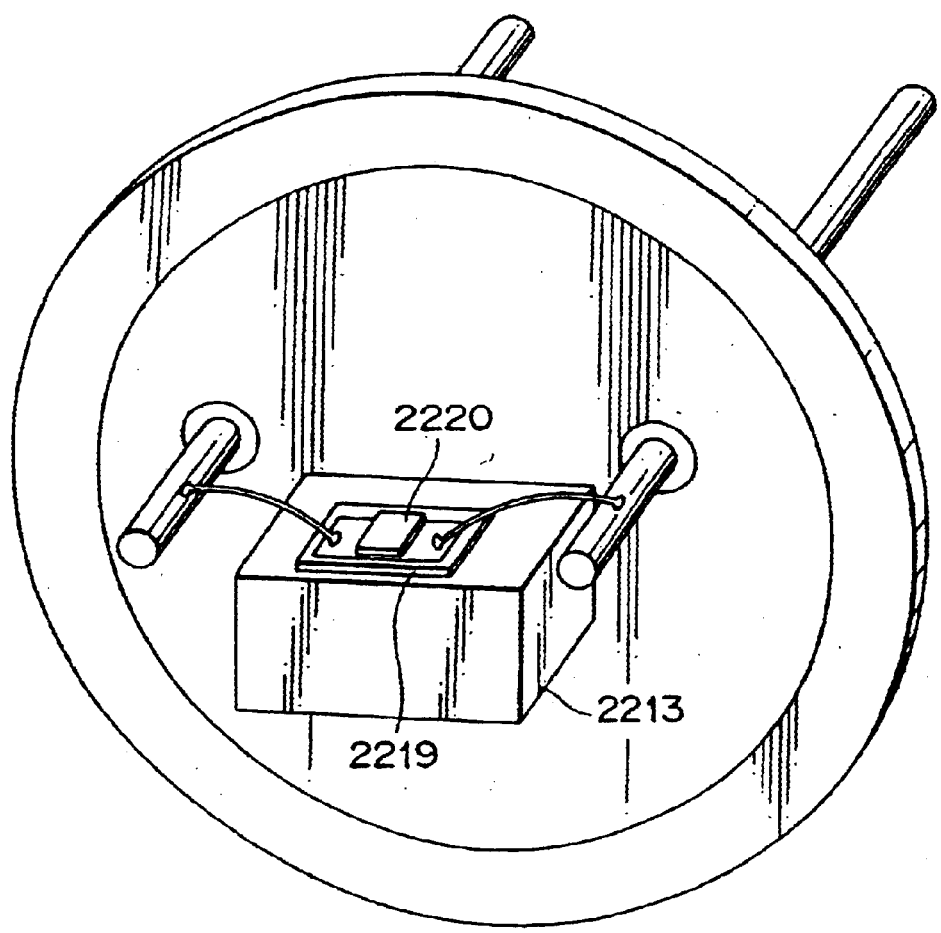
FIG. 1 is a perspective view showing a configuration of a related art semiconductor device.
Figure 2:
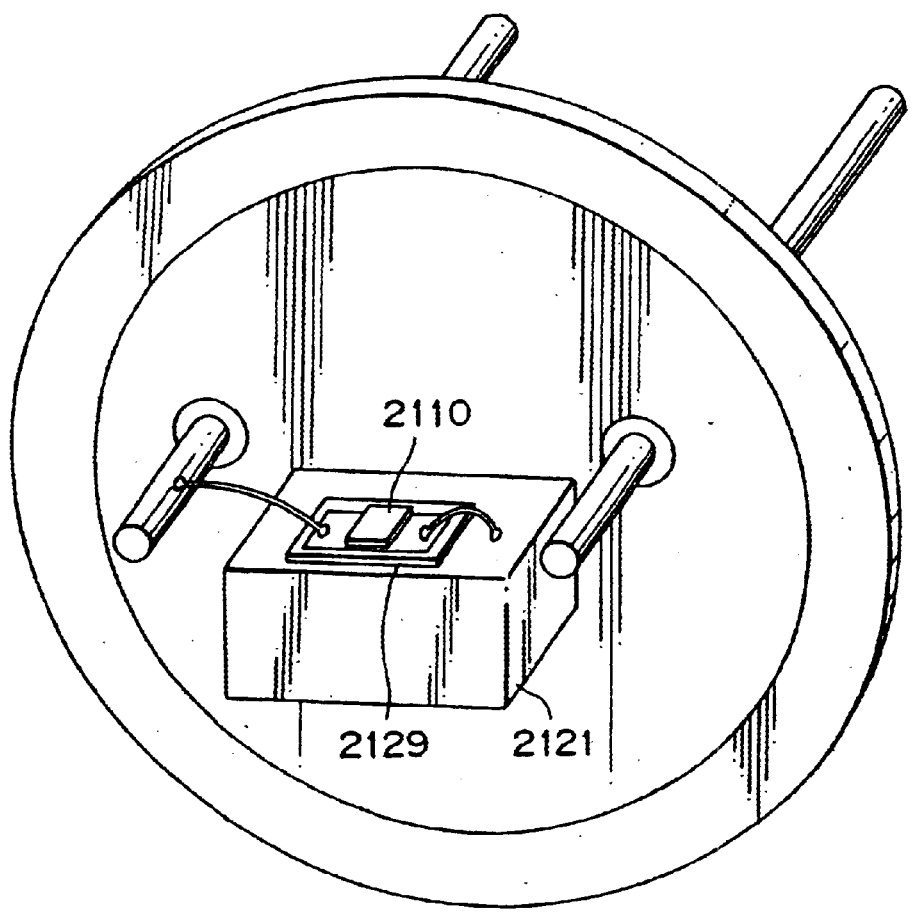
FIG. 2 is a perspective view showing a configuration of another related art semiconductor light emitting device.
Figure 3:
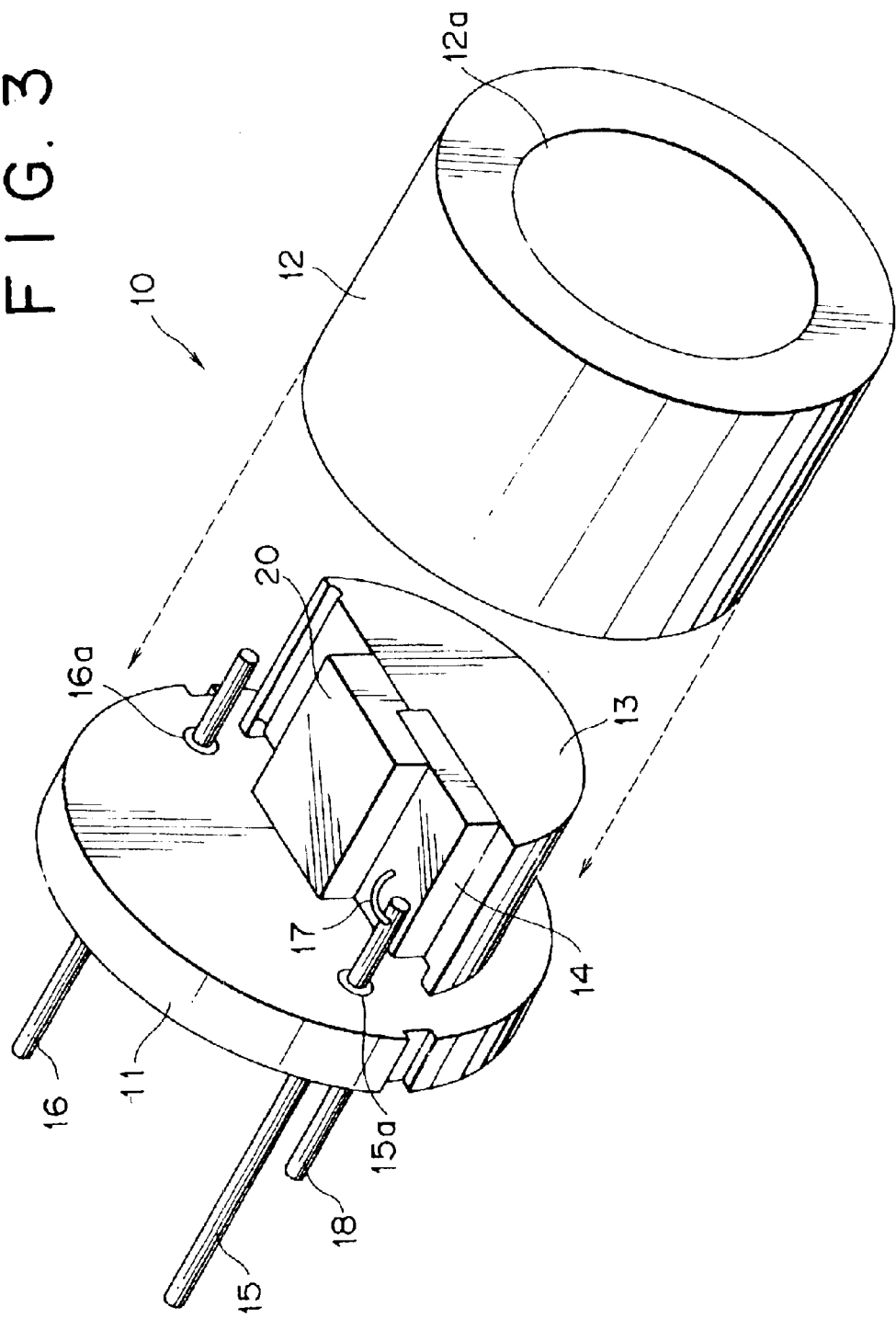
FIG. 3 is a partially exploded perspective view showing a configuration of a semiconductor light emitting device according to a first embodiment of the present invention.

FIG. 3 shows the entire configuration of a semiconductor light emitting device as a semiconductor device and a package 10 according to a first embodiment of the present invention. The semiconductor light, emitting device includes a semiconductor laser 20 as a semiconductor element in the package 10. The package 10 has a disk shaped support 11 and a hollowed cylinder shaped cover body 12. One end side of the cover body 12 is opened and the other end side thereof is closed. The end portion of the cover body 12 on the open side is in contact with one surface of the support 11. The end portion of the cover body 12 on the closed side is provided with an extraction window 12a for extracting a laser beam, emitted from the semiconductor laser 20 contained in the package 10, out of the package 10. The cover body 12 is made from a metal such as a copper (Cu) or iron (Fe) based metal, and the extraction window 12a is made from a material allowing transmission of a laser beam emitted from the semiconductor laser 20, for example, glass or plastic.

Inside the cover body 12, a conductive mounting board 13 on which the semiconductor laser 20 is to be mounted is formed over one surface of the support 11. The conductive mounting board 13 is adapted to electrically connect the semiconductor laser 20 to a power source (not shown) and to radiate heat generated in the semiconductor laser 20. The conductive mounting board 13 and the support 11 are integrally cast from a metal such as a copper or iron based metal, on the surfaces of which a solder film made from a solder material and having a thickness of 5 µm is formed. Specific examples of the solder materials may include tin (Sn), lead (Pb), a tin-lead alloy, a gold (Au)-tin alloy, an indium (In)-tin alloy, and an indium-lead.

Figure 4:
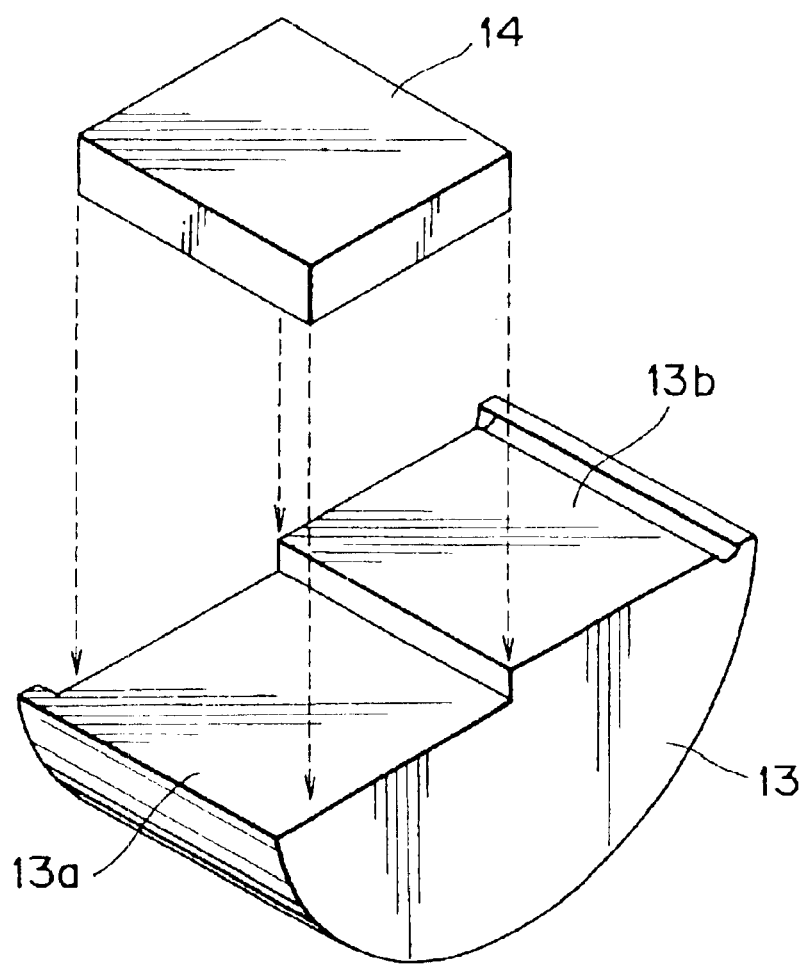
FIG. 4 is a perspective view of a conductive mounting board of the semiconductor light emitting device shown in FIG. 3.

As enlargedly shown in FIG. 4, the conductive mounting board 13 has, on the surface on which the semiconductor laser 20 is to be mounted, a recessed portion 13a and a projecting portion 13b. These recessed portion 13a and the projecting portion 13b are parallel to the surface of the support 11. The size of each of the recessed portion 13a and the projecting portion 13b is set such that the width in the direction parallel to the surface of the support 11 is 0.8 mm and the depth in the direction perpendicular to the surface of the support 11 is 1 mm. The difference in height between the mounting surfaces of the recessed portion 13a and the projecting portion 13b is set at 300 µm. In addition, the thickness of the conductive mounting board 13 in the direction perpendicular to the mounting surface of the conductive mounting board 13 may be suitably determined depending on the size of the cover body 12, however, it is preferred to make it as large as possible in order to increase the heat radiation effect.

Figure 5:
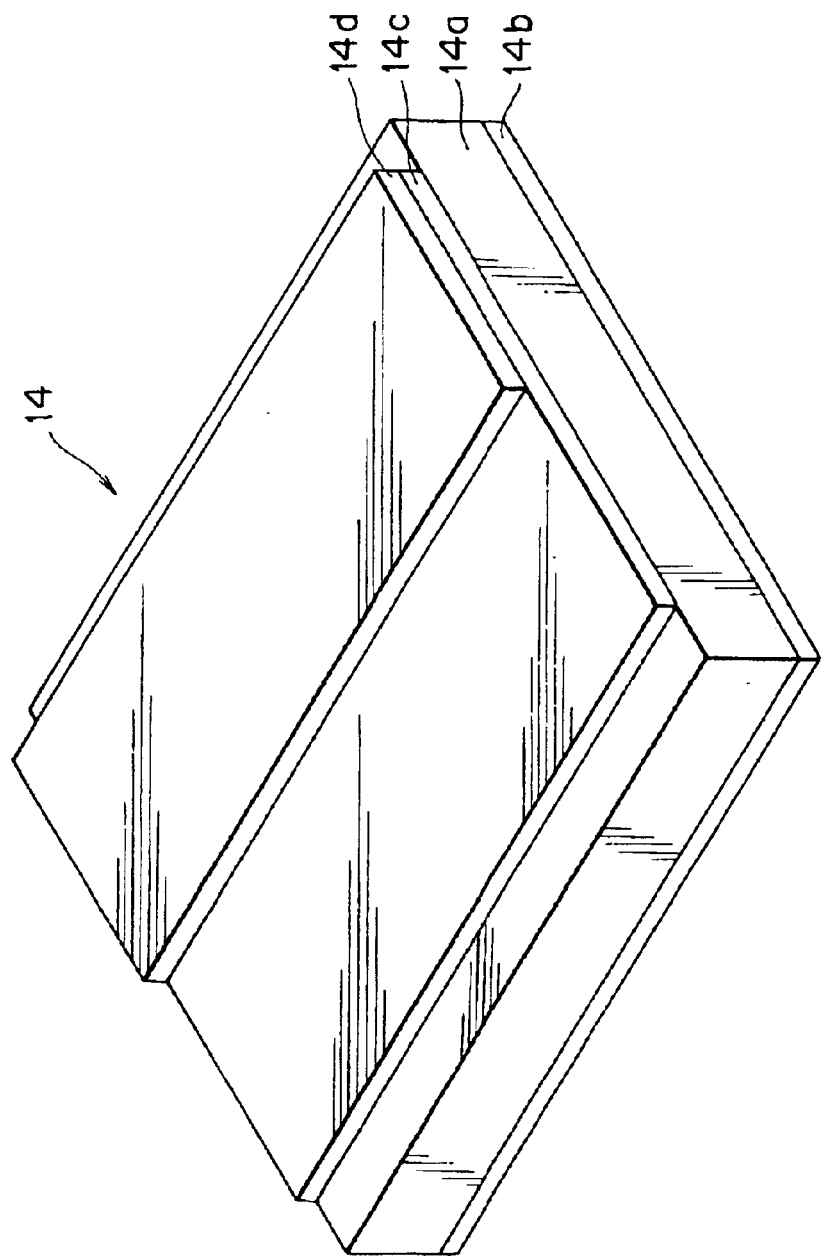
FIG. 5 is a perspective view of an insulating mounting board of the semiconductor light emitting device shown in FIG. 3.

An insulating mounting board 14 is mounted on the recessed portion 13a of the conductive mounting board 13. As enlargedly shown in FIG. 5, the insulating mounting board 14 has an insulating board 14a made from an insulating material such as aluminum nitride (AlN), boron nitride (BN), or silicon carbide (SiC). An adhesive layer 14b is provided on the surface, on the conductive mounting board 13 side, of the insulating board 14a, and is adapted to fix the insulating mounting board 14 to the conductive mounting board 13. The adhesive layer 14b is formed by stacking a titanium (Ti) layer having a thickness of 100 nm, a platinum (Pt) layer having a thickness of 200 nm, and a gold (Au) layer having a thickness of 500 nm on the insulating board 14a in this order. A wiring portion 14c is formed on the surface, opposed to the conductive mounting board 13, of the insulating board 14a. The wiring portion 14c is formed by stacking a titanium layer having a thickness of 100 nm, a platinum layer having a thickness of 200 nm, and a gold layer having a thickness of 500 nm on the insulating board 14a in this order.

A solder adhesive layer 14d made from a solder material is provided on a portion of the surface, opposed to the insulating board layer 14a, of the wiring portion 14c, which solder adhesive layer 14d is adapted to be adhesively bonded to the semiconductor laser 20. The thickness of the solder adhesive layer 14d is preferably set at a value of 4 µm or more for ensuring a sufficient adhesive strength of the solder adhesive layer 14d. The solder material for forming the solder adhesive layer 14d may be the same as that for forming the solder film of the conductive mounting board 13, however, the solder material is preferably selected to have a melting point lower than that of the solder material for forming the solder film of the conductive mounting board 13. The reason for this is that, as will be later apparent in description of the fabrication method, in the case of adhesively bonding the conductive mounting board 13, the insulating mounting board 14, and the semiconductor laser 20 to each other, the insulating mounting board 14 is less in thermal conduction than the conductive mounting board 13.

The soldering temperatures of the above solder materials become lower in the order of In—Sn alloy (for example, 52 wt % In and 48 wt % Sn), In—Pb alloy (for example, 75 wt % In and 25 wt % Pb), Sn—Pb alloy (for example, 50 wt % Sn and 50 wt % Pb), Sn, Au—Sn alloy (for example, 80 wt % Au and 20 wt % Sn), and Pb. For example, if the solder film on the surface of the conductive mounting board 13 is made from Sn, the solder adhesive layer 14d of the insulating mounting board 14 is preferably made from a Sn—Pb alloy.

The size of the insulating mounting board 14 is set such that the width in the direction parallel to the surface of the support 11 is 0.8 mm each and the depth in the direction perpendicular to the surface of the support 11 is 1 mm. The thickness of the insulating mounting board 14 in the direction perpendicular to the mounting surface of the insulating mounting board 14 is preferably set to be equal to or more than the difference in height between the mounting surfaces of the recessed portion 13a and the projecting portion 13b of the conductive mounting board 13. Here, since the difference in height between the mounting surfaces of the recessed portion 13a and the projecting portion 13b is set at 300 µm, the thickness of the insulating mounting board 14 is preferably set at a value of 300 µm or more. For the purpose of ensuring the insulation of the insulating mounting board 14 against the conductive mounting board 13, the thickness of the insulating mounting board 14 is preferably set at a value of 500 µm or more.

As shown in FIG. 3, the support 11 is provided with a pair of pins 15 and 16 extending from inside to outside of the cover body 12. Each of the pins 15 and 16 is made from a metal such as a copper or iron based metal and the surface thereof is coated with a thin film made from gold. Insulating rings 15a and 16a made from glass are inserted between the support 11 and the pins 15 and 16, respectively, for electrically insulating the support 11 from the pins 15 and 16. That is to say, the conductive mounting board 13 is electrically insulated from the pins 15 and 16. One end of a wire 17 made from gold having a thickness of 20 µm is connected to the pin 15, and the other end of the wire 17 is connected to the wiring portion 14c of the insulating mounting board 14 for electrically connecting the pin 15 to the wiring portion 14c. The support 11 is also provided with a pin 18 which is electrically connected to both the support 11 and the conductive mounting board 13.

Figure 6:
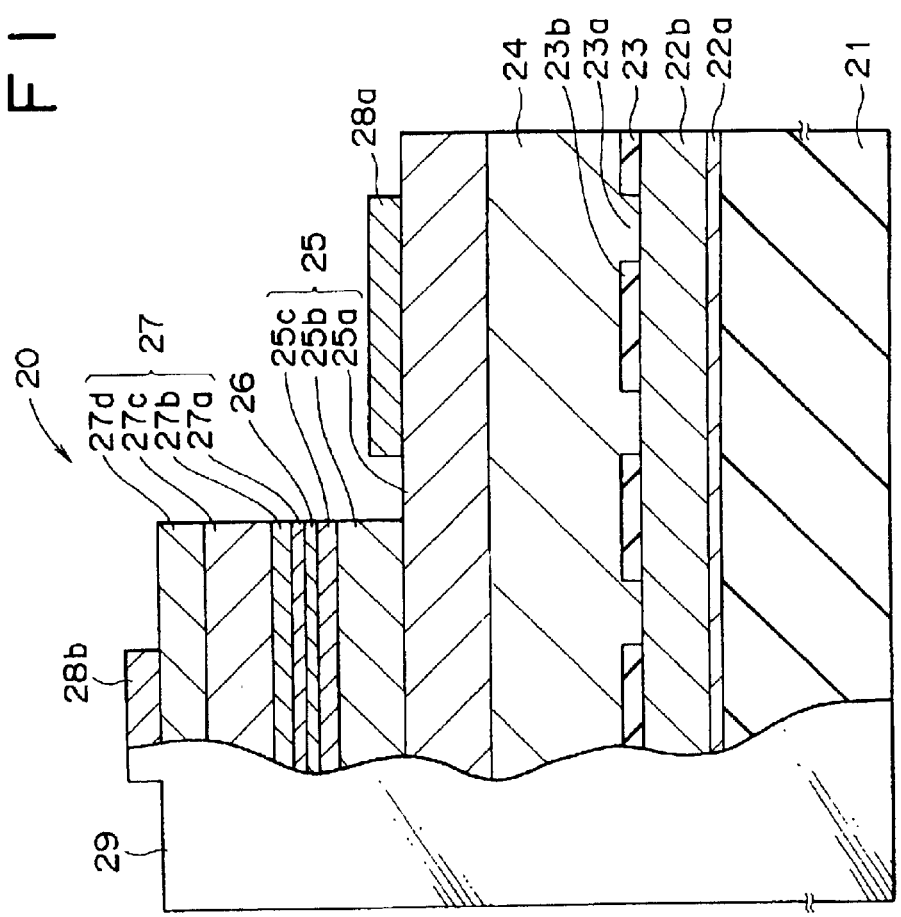
FIG. 6 is a partial sectional view of a semiconductor laser of the semiconductor light emitting device shown in FIG. 3.

As shown in FIG. 6, the semiconductor laser 20 is formed by sequentially stacking a buffer layer 22a, a backing layer 22b, a mask layer 23, a coating growth layer 24, an n-type semiconductor layer 25 as a first conduction type semiconductor layer, an active layer 26, and a p-type semiconductor layer 27 as a second conduction type semiconductor layer on one surface of a pair of opposed surfaces of a substrate 21 in this order. The substrate 21 is formed of a sapphire having a thickness in the stacking direction (hereinafter, referred to simply as "thickness") of 300 µm, and the buffer layer 22a is formed on the C-face of the substrate 21.

The buffer layer 22a, which has a thickness of 30 nm, is made from an undoped GaN. The backing layer 22b, which has a thickness of 2 µm, is made from a crystal of undoped GaN. The mask layer 23, which has a thickness of 0.1 µm, is made from silicon nitride ($SiO_2$). The mask layer 23 has a plurality of stripe-shaped openings 23a extending in the direction perpendicular to the paper plane in FIG. 6, and a plurality of stripe shaped mask portions 23b each formed between adjacent two of the openings 23a. The coating growth layer 24 grows laterally on the mask layer 23, to thereby cutoff penetration of dislocations from the backing layer 22b. The coating growth layer 24, which has a thickness of 10 µm, is made from undoped GaN.

The n-type semiconductor layer 25 is formed by stacking an n-side contact layer 25a, an n-type clad layer 25b, and a first guide layer 25c on the coating growth layer 24 in this order. The n-side contact layer 25a, which has a thickness of 3 µm, is made from n-type GaN doped with an n-type impurity such as silicon (Si). The n-type clad layer 25b, which has a thickness of 1 µm, is made from a mixed crystal, n-type $Al_{0.1}Ga_{0.9}N$ doped with an n-type impurity such as silicon. The first guide layer 25c, which has a thickness of 0.1 µm, is made from n-type GaN doped with an n-type impurity such as silicon.

The active layer 26 is made from a mixed crystal, undoped InGaN, and has a multiple quantum well structure including a well layer having a thickness of 3 nm and made from a mixed crystal, $In_{0.15}Ga_{0.85}N$, and a barrier layer having a thickness of 4 nm and made from a mixed crystal, $In_{0.02}Ga_{0.98}N$. The active layer 26 functions as a light emitting layer. For example, upon laser oscillation, the emission wavelength is set at about 405 nm.

The p-type semiconductor layer 27 is formed by stacking a deterioration preventive layer 27a, a second guide layer 27b, a p-type clad layer 27c, and a p-side contact layer 27d on the active layer 26 in this order. The deterioration preventive layer 27a, which has a thickness of 20 nm, is made from a mixed crystal, p-type $Al_{0.2}Ga_{0.8}N$ doped with a p-type impurity such as magnesium (Mg). The second guide layer 27b, which has a thickness of 0.1 µm, is made from p-type GaN doped with a p-type impurity such as magnesium. The p-type clad layer 27c, which has a thickness of 0.8 µm, is made from a mixed crystal, p-type $Al_{0.1}Ga_{0.9}N$ doped with a p-type impurity such as magnesium. The p-side contact layer 27d, which has a thickness of 0.5 µm, is made from a mixed crystal, p-type GaN doped with an impurity such as magnesium.

An n-side electrode 28a as a first electrode is provided on the surface, on the active layer 26 side in the stacking direction, of the n-side contact layer 25a. The n-side electrode 28a is formed by stacking a titanium layer, an aluminum (Al) layer, and a gold layer on the n-side contact layer 25a in this order and alloying these metals by heating, to be thus electrically connected to the n-side contact layer 25a. A p-side electrode 28b as a second electrode is provided on the surface, opposed to the active layer 26 in the stacking direction, of the p-side contact layer 27d. The p-side electrode 28b is formed by stacking a nickel (Ni) layer and a gold layer on the p-side contact layer 27d in this order and alloying these metals by heating, to be thus electrically connected to the p-side contact layer 27d. The p-side electrode 28b is formed into a stripe shape extending in the direction perpendicular to the paper plane in FIG. 6 for current constriction, and a region of the active layer 26 corresponding to the p-side electrode 28b becomes a light emission region.

The semiconductor laser 20 has a pair of reflector films 29 (only one is shown in FIG. 6) at both ends of the p-side electrode 28b in the length direction. Each reflector film 29 is formed by alternately stacking silicon nitride films and zirconium oxide (ZrO) films. The reflectance of one reflector film 29 is set at a low value and the reflectance of the other reflector film (not shown) is set at a high value, so that light generated from the active layer 26 is reciprocated between the pair of reflector films 29 to be amplified, and is emitted from one reflector film 29 as a laser beam. That is to say, the length direction of the p-side electrode 28b becomes the resonator orientation.

The semiconductor laser 20 is, as shown in FIG. 3, disposed in the package 10 in such a manner that the n-side electrode 28a is in contact with the solder adhesive layer 14d of the insulating mounting board 14 and the p-side electrode 28b is in contact with the projecting portion 13b of the conductive mounting board 13. To be more specific, the n-side electrode 28a is connected to the power source (not shown) by means of the pin 15 via the wiring portion 14c of the insulating mounting board 14 and the wire 17, and the p-side electrode 28b is electrically connected to the power source (not shown) by means of the pin 18 via the conductive mounting board 13. The reason why the p-side electrode 28b is in contact with the conductive mounting board 13 is that the active layer 26 acting as a main heat generation source is disposed between the p-side electrode 28b and the substrate 21. That is to say, it is possible to obtain a high heat radiation effect by shortening the distance between the active layer 26 and the conductive mounting board 13 having a high heat radiation characteristic.

The semiconductor device and the package 10 having the above configurations are fabricated in accordance with the following procedure:

First, a semiconductor laser 20 is formed as follows: A substrate 21 made from a sapphire having a plurality of semiconductor laser formation regions is prepared. A buffer layer 22a made from undoped GaN and a backing layer 22b made from undoped GaN are allowed to sequentially grow on one surface (C-face) of the substrate 21 by MOCVD (Metal Organic Chemical Vapor Deposition). A mask layer 23 having a plurality of stripe shaped mask portions 23b made from silicon dioxide is selectively formed on the backing layer 22b by CVD (Chemical Vapor Deposition). A coating growth layer 24 made from undoped GaN is allowed to laterally grow on the mask layer 23 by MOCVD.

Then, an n-side contact layer 25a made from n-type GaN, an n-type clad layer 25b made from n-type $Al_{0.1}Ga_{0.9}N$ (mixed crystal), a first guide layer 25c made from n-type GaN, an active layer 26 made from undoped GaInN (mixed crystal), a deterioration preventive layer 27a made from p-type $Al_{0.2}Ga_{0.8}N$ (mixed crystal), a second guide layer 27b made from p-type GaN, a p-type clad layer 27c made from p-type $Al_{0.1}Ga_{0.9}N$ (mixed crystal), and a p-side contact layer 27d made from p-type GaN are allowed to sequentially to grow on the coating growth layer 24 by MOCVD.

After growing the layers in the order from the n-side contact layer 25a to the p-side contact layers 27d, the p-side contact layer 27d, the p-type clad layer 27c, the second guide layer 27b, the deterioration preventive layer 27a, the active layer 26, the first guide layer 25c, and the n-type clad layer 25b are selectively removed in sequence correspondingly to a formation position of an n-side electrode 12 by lithography, to expose the n-side contact layer 25a. An n-side electrode 28b is then selectively formed on the n-side contact layer 25a. After formaing of the n-side electrode 28a, a p-side electrode 28b is selectively formed on the p-side contact layer 27d. The n-side electrode 28a and the p-side electrode 28b are then each alloyed by heating.

After forming the n-side electrode 28a and the p-side electrode 28b, the substrate 21 is divided, in the direction perpendicular to the length direction of the p-side electrode 28b, into parts each having a specific length corresponding to that of each semiconductor laser formation region. A pair of reflector films 29 are formed on a pair of side surfaces of the divided part by, for example, an electron beam evaporation process. Then, the substrate 21 is divided, in the direction parallel to the length direction of the p-side electrode 28b, into parts having a specific width corresponding to that of each semiconductor laser formation region, to form a semiconductor laser 20.

After that, a support 11 and a conductive mounting board 13 having a recessed portion 13a and a projecting portion 13b are integrally cast, and a solder film is vapor-deposited on the surfaces of the support 11 and the conductive mounting board 13. Pins 15, 16 and 18 separately formed are mounted to the support 11. Then, an insulating board 14a is separately formed, and an adhesive layer 14b is vapor-deposited on one surface of the insulating board 14a and a wiring portion 14c and a solder adhesive layer 14d are sequentially vapor-deposited on the other surface of the insulating board 14a, to form an insulating mounting board 14. After forming the insulating mounting board 14, the conductive mounting board 13 integrated with the support 11 is put in a heating apparatus (not shown), and the insulating mounting board 14 is mounted on a recessed portion 13a of the conductive mounting board 13, and the p-side electrode 28b of the semiconductor laser 20 is brought into contact with the projecting portion 13b of the conductive mounting board 13 and the n-side electrode 28a of the semiconductor laser 20 is brought into contact with the solder adhesive layer 14d of the insulating mounting board 14.

The conductive mounting board 13 is heated for 5 to 20 seconds up to a temperature ranging from 240 to 300° C. and held at the temperature for 10 to 60 seconds by the heating apparatus (not shown). With this heat-treatment, the solder film of the conductive mounting board 13 is melted to adhesively bond the conductive mounting board 13 to the insulating mounting board 14 and also to adhesively bond the conductive mounting board 13 to the p-side electrode 28b of the semiconductor laser 20, and simultaneously the solder adhesive layer 14d of the insulating mounting board 14 is melted to adhesively bond the insulating mounting board 14 to the n-side electrode 28a of the semiconductor laser 20.

In this case, by setting the melting point of a solder material of the solder adhesive layer 14d of the insulating mounting board 14 to be lower than that of a solder material of the solder film of the conductive mounting board 13, both solder materials can be desirably melted without excessively increasing the heating temperature. The heating is preferably performed in an atmosphere of a nitrogen gas ($N_2$) or hydrogen gas ($H_2$) or a mixed gas thereof for preventing oxidation of the solder materials. Also the semiconductor laser 20 may be pushed down, for example, by applying a load thereon for preventing the positions of the insulating mounting board 14 and the semiconductor laser 20 from being deviated due to the surface tension of the solder materials.

A wire 17 is then laid out to connect the wiring portion 14c of the insulating mounting board 14 to the pin 15. After that, a cover body 12 separately formed is disposed on the support 11 in an dried nitrogen atmosphere, thereby completing fabrication of the semiconductor light emitting device and the package thereof as shown in FIG. 3.

The functions of the semiconductor light emitting device and the package 10 thus obtained will be described below.

In the semiconductor light emitting device, when a specific voltage is applied between the n-side electrode 28a and the p-side electrode 28b of the semiconductor laser 20 via the pins 15 and 18 of the package 10, a current is injected into the active layer 26 to cause light emission by recombination of electrons with positive holes. The light is reciprocated between the pair of reflector films 29 to be amplified, and is emitted from one reflector film 29 as a laser beam. The laser beam thus emitted from the semiconductor laser 20 is extracted outwardly from the package 10 via the extraction window 12a of the package 10.

At this time, in the semiconductor laser 20, heat generation occurs mainly at the active layer 26. In this embodiment, since the conductive mounting board 13 is directly connected to the p-side electrode 28b to shorten the distance between the active layer 26 and the conductive mounting board 13, heat generated in the active layer 26 is positively radiated via the conductive mounting board 13. As a result, the temperature rise of the semiconductor laser 20 is suppressed, so that the semiconductor laser 20 can be stably operated for a long-period of time.

Further, in this embodiment, since the insulating mounting board 14 is disposed on the recessed portion 13a of the conductive mounting board 13 and the n-side electrode 28a is electrically connected to the wiring portion 14c of the insulating mounting board 14, the insulation between the conductive mounting board 13 and the wiring portion 14c is ensured, to thereby prevent short-circuit between the n-side electrode 28a and the p-side electrode 28b.

In this way, according to the semiconductor light emitting device in this embodiment, since the p-side electrode 28b is directly connected to the conductive mounting board 13, the distance between the active layer 26 and the conductive mounting board 13 can be shortened, and consequently, heat generated in the active layer 26 can be positively radiated via the conductive mounting board 13. As a result, it is possible to suppress the temperature rise of the semiconductor laser 20 and to stably operate the semiconductor laser 20 for a long-period of time, and hence to improve the reliability of the semiconductor light emitting device.

Also since the insulating mounting board 14 is disposed on the recessed portion 13a of the conductive mounting board 13 and the n-side electrode 28a is connected to the wiring portion 14c of the insulating mounting board 14, it is possible to ensure insulation between the conductive mounting board 13 and the wiring portion 14c, and hence to prevent short-circuit between the n-side electrode 28a and the p-side electrode 28b of the semiconductor laser 20.

According to the package 10 in this embodiment, since the recessed portion 13a and the projecting portion 13b are formed on the conductive mounting board 13 and the insulating mounting board 14 is disposed on the recessed portion 13a, it is possible to prevent short-circuit between the n-side electrode 28a and the p-side electrode 28b of the semiconductor laser 20 by disposing the n-side electrode 28a of the semiconductor laser 20 on the wiring portion provided on the insulating mounting board 14 and disposing the p-side electrode 28b on the conductive mounting board 13. Also it is possible to positively radiate heat generated in the active layer 26 of the semiconductor laser 20 via the conductive mounting board 13.

(Second Embodiment)

Figure 7:
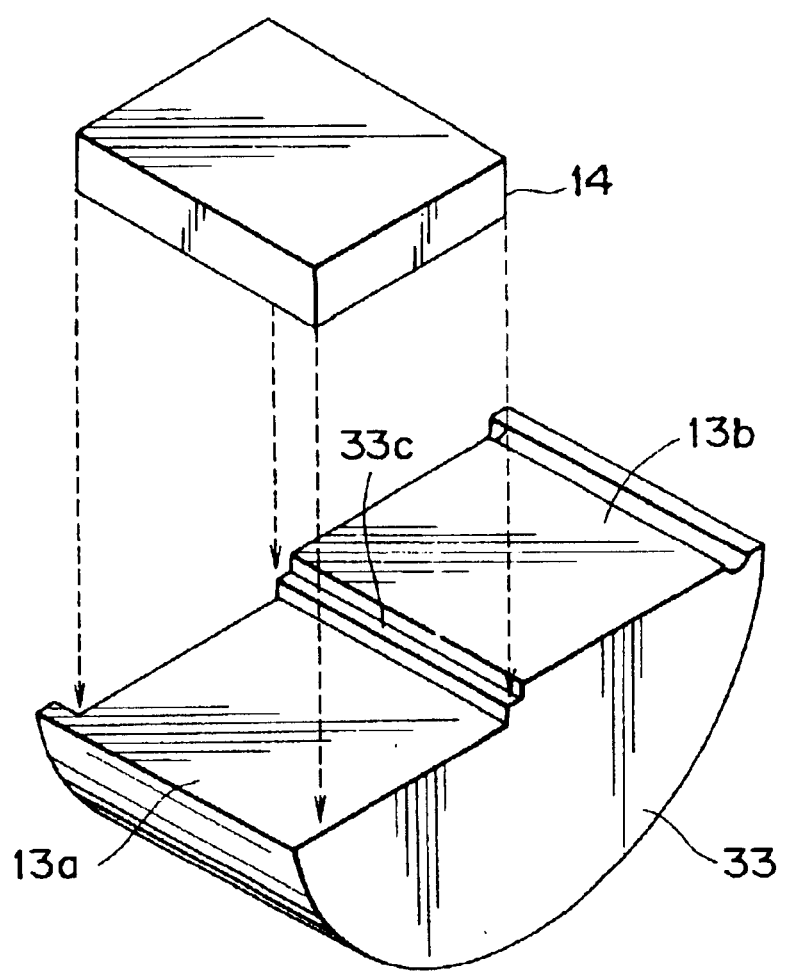
FIG. 7 is an exploded perspective view of a portion of a semiconductor light emitting device according to a second embodiment of the present invention.

FIG. 7 shows a portion of a semiconductor light emitting device and a portion of a package according to a second embodiment of the present invention. The semiconductor light emitting device and the package in this embodiment have the same configurations and the functions of those in the first embodiment, except that a separating portion 33c is provided on a conductive mounting board 33. And also they can be fabricated in the same manner as that in the first embodiment. In this embodiment, therefore, parts corresponding to those in the first embodiment are designated by the same reference numerals as those in the first embodiment, and the detailed explanation thereof is omitted.

The separating portion 33c is formed between a recessed portion 13a and a projecting portion 13b formed on the mounting surface of the conductive mounting board 33 in such a manner as to have a median height between heights of the recessed portion 13a and the projecting portion 13b. The separating portion 33c is adapted to separate the conductive mounting board 33 from an insulating mounting board 14 with a gap kept therebetween, thereby preventing short-circuit between the n-side electrode 28a and the p-side electrode 28b of the semiconductor laser 20.

In this way, according to this embodiment, since the separating portion 33c is provided between the recessed portion 13a and the projecting portion 13b of the conductive mounting board 33, it is possible not only to obtain the same effects as those obtained in the first embodiment, but also to further effectively prevent short-circuit between the n-side electrode 28a and the p-side electrode 28b of the semiconductor laser 20.

(Third Embodiment)

FIG. 8 shows a portion of a semiconductor light emitting device and a portion of a package according to a third embodiment of the present invention. The semiconductor light emitting device and the package in this embodiment have the same configurations as those in the second embodiment, except that a position fixing portion 43d is provided on a conductive mounting board 43, having the same functions as those in the first embodiment and can be fabricated in the same manner as that in the first embodiment. Accordingly, parts corresponding to those in the first and second embodiments are designated by the same reference numerals as those in the first and second embodiments, and the detailed description thereof is omitted.

The position fixing portion 43d is formed on the mounting surface of the conductive mounting board 43 in such a manner as to provide a recessed portion 13a between a projecting portion 13b and the position fixing portion 43d. The position fixing portion 43d projects upwardly from the recessed portion 13a, and holds an insulating mounting board 14 between a separating portion 33c and the position fixing portion 43d for preventing the position of the insulating mounting board 14 from being deviated upon soldering the insulating mounting board 14 to the conductive mounting board 13.

In this way, according to this embodiment, since the position fixing portion 43d is provided on the conductive mounting board 33 in such a manner as to provide the recessed portion 13a between the projecting portion 13b and the position fixing portion 43d, it is possible not only to obtain the same effects as those obtained in the first embodiment, but also to easily and accurately dispose the insulating mounting board 14 on the conductive mounting board 43.

(Fourth Embodiment)

FIG. 9 shows a portion of a semiconductor light emitting device and a portion of a package according to a fourth embodiment of the present invention. The semiconductor light emitting device and the package in this embodiment have the same configurations and the functions as those in the first embodiment, except that the configurations of a conductive mounting board 53 and an insulating mounting board 54 are different from those in the first embodiment. Accordingly, parts corresponding to those in the first embodiment are designated by the same reference numerals as those in the first embodiment, and the detailed explanation thereof is omitted.

The conductive mounting board 53 is cast, integrally with a support 11, from a metal such as a copper or iron based metal. A thin film made from a metal such as gold or nickel (Ni) is formed on the surfaces of the conductive mounting board 53 and the support 11. Then, a solder adhesive layer 53e made from a solder material as described in the first embodiment is provided on the surface of a projecting portion 13b. The solder adhesive layer 53e is adapted to adhesively bond a p-side electrode 28b of a semiconductor laser 20 to the projecting portion 13b. The other configuration of the conductive mounting board 53 is the same as that of the conductive mounting board 13 described in the first embodiment.

The insulating mounting board 54 has an insulating board 54a made from silicon dioxide being formed on a recessed portion 13a of the conductive mounting board 53 by deposition. A wiring portion 54c is provided on the side, opposed to the conductive mounting board 53, of the insulating board 54a. The wiring portion 54c is formed by stacking a titanium layer having a thickness of 50 nm and a gold layer having a thickness of 500 nm on the insulating board 54a in this order. A solder adhesive layer 54d made from the same solder material as that for forming the solder adhesive layer 53e is provided on a portion of the wiring portion 54c on the side opposed to the insulating board 54a. The solder adhesive layer 54d is adapted to adhesively bond an n-side electrode 28a of the semiconductor laser 20 to the wiring portion 54c. The solder material for forming the solder adhesive layer 54d may be different from that for forming the solder adhesive layer 53e, however, the solder material is preferably the same as that for forming the solder adhesive layer 53e in order to form the solder adhesive layer 54d together with the solder adhesive layer 53e at the same step in the fabrication method to be described later. The thickness of the solder adhesive layer 54d is set at the same value as that of the solder adhesive layer 14d in the first embodiment. The size of the insulating mounting board 54 is set at the same value as that of the insulating mounting board 14 in the first embodiment.

The semiconductor light emitting device and the package having the above configurations are fabricated in the following procedure:

First, a semiconductor laser 20 is formed in the same manner as that in the first embodiment. Then, a support 11 and a conductive mounting board 53 are integrally cast, and a thin film made from metal such as gold is formed on the surfaces of the support 11 and the conductive mounting board 53 by plating.

Figure 10:
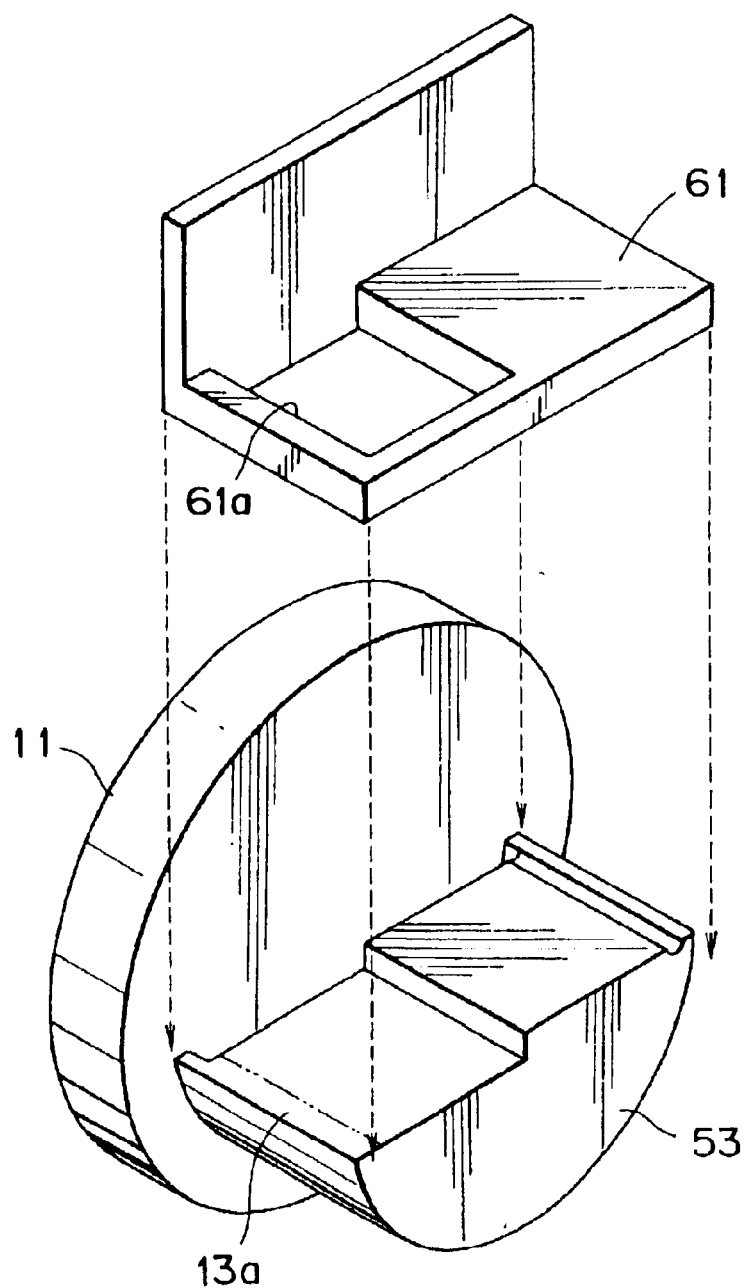
FIG. 10 is a perspective view showing one step of fabricating the semiconductor light emitting device shown in FIG. 9.

The support 11 and the conductive mounting board 53 are cleaned, and as shown in FIG. 10, a mold 61 having an opening 61a formed correspondingly to a recessed portion 13a of the conductive mounting board 53 is placed on the conductive mounting board 53 with the opening 61a aligned with the recessed portion 13a. In this case, it may be desirable that one side of the opening 61a be positioned at the boundary between the recessed portion 13a and a projecting portion 13b of the conductive mounting board 53. After that, silicon dioxide is vapor-deposited from above onto the mold 61 at 200° C. by the electron beam evaporation process, to form an insulating board 54a on a crosshatched portion in FIG. 10. In addition, the size of the opening 61a of the mold 61 is preferably larger than that of the recessed portion 13a. The reason for this is that if the size of the opening 61a is smaller than that of the recessed portion 13a, the size of an insulating mounting board 54 becomes smaller, thereby making it impossible to prevent short-circuit between the n-side electrode 28a and the p-side electrode 28b of the semiconductor laser 20. Here, the width of the opening 61a in the direction parallel to the support 11 is set at 0.8 mm, and the depth of the opening 61a in the direction perpendicular to the support 11 is set at 1.1 mm.

After forming the insulating board 54a, as shown in FIG. 11, a mold 62 having an opening 62a formed correspondingly to the insulating substrate 54a is placed on the conductive mounting board 53 with the opening 62a aligned with the insulating board 54a. Then, titanium, platinum and gold are sequentially vapor-deposited from above onto the mold 62, to form a wiring portion 54c on a crosshatched portion as shown in FIG. 11. In addition, the size of the opening 62a is preferably smaller than that of the opening 61a of the mold 61 for preventing short-circuit between the n-side electrode 28a and the p-side electrode 28b of the semiconductor laser 20. Here, the width of the opening 62a is set at 0.7 mm and the depth thereof is set at 1.0 mm. In other words, the opening 62a of the mold 62 is positioned inside of the opening 61a of the mold 61.

Figure 12:
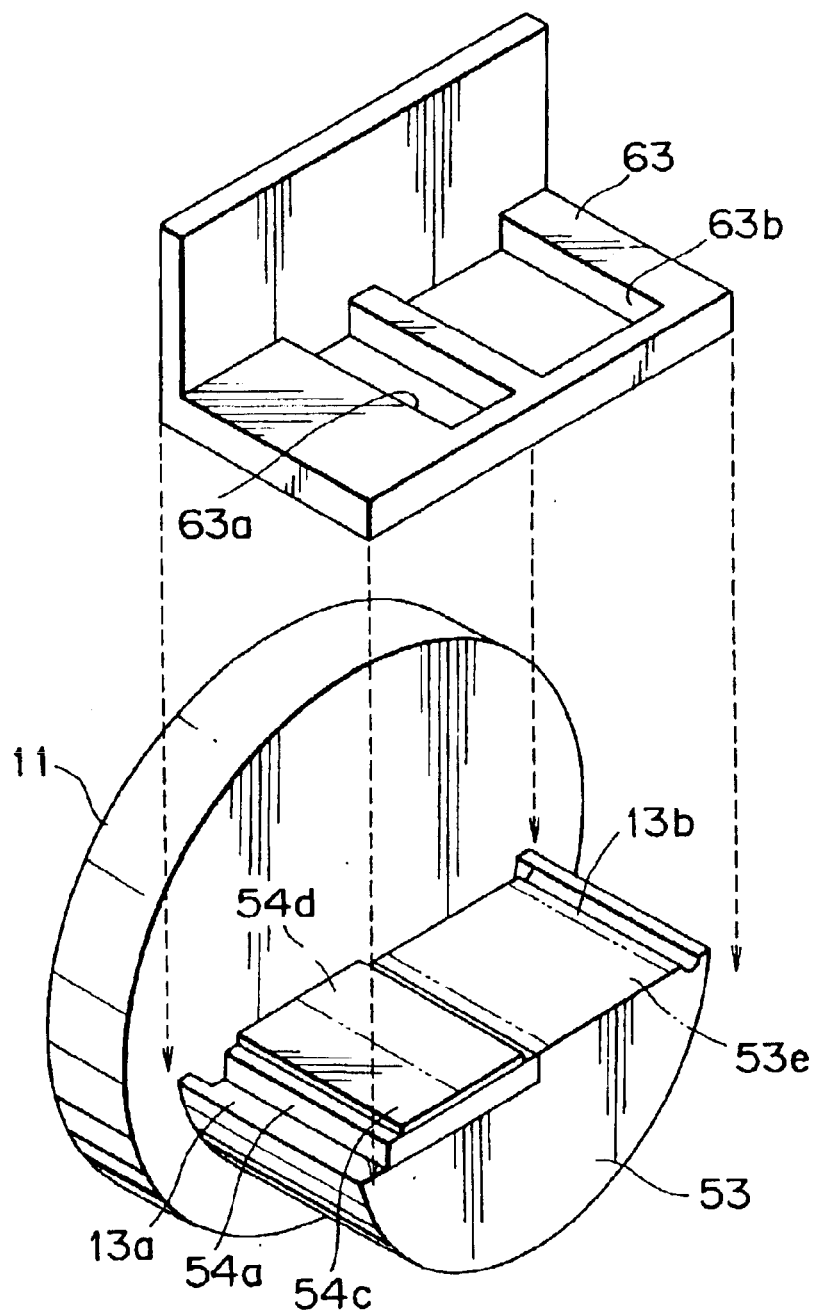
FIG. 12 is a perspective view showing a fabrication step subsequent to that shown in FIG. 11.

After forming the wiring portion 54c, as shown in FIG. 12, a mold 63 having an opening 63a formed correspondingly to the wiring portion 54c and having an opening 63b formed correspondingly to the projecting portion 13b of the conductive mounting board 53 is placed on the conductive mounting board 53 in such a manner that the opening 63a is aligned with the wiring portion 54c and the opening 63b is aligned with the projecting portion 13b. Then, a solder material is vapor-deposited from above onto the mold 63 by the vapor-deposition process, to form a solder adhesive layer 54d and a solder adhesive layer 53e at crosshatched portions as shown in FIG. 12. In addition, the size of the opening 63a is preferably smaller than that of the opening 61a of the mold 61 for preventing short-circuit between the n-side electrode 28a and the p-side electrode 28b of the semiconductor laser 20. Here, the width of the opening 63a is set at 0.35 mm and the depth thereof is set at 1.0 mm. In other words, the opening 63a of the mold 63 is positioned inside of the opening 61a of the mold 61. The size of the opening 63b is set such that the width is 0.80 mm and the depth is 1.0 mm.

After forming the solder adhesive layers 53e and 54d, pins 15, 16 and 18 separately formed are disposed to the support 11. Then, the semiconductor laser 20 is disposed on the conductive mounting board 53 and the insulating mounting board 54 in the same manner as that described in the first embodiment. After that, like the first embodiment, a wire 17 is laid out to connect the wiring portion 54c to the pin 15 therebetween, and then a cover body 12 separately formed is disposed on the support 11. In this way, the semiconductor light emitting device and the package shown in FIG. 9 is obtained.

In this way, according to this embodiment, since the insulating mounting board 54 is formed on the recessed portion 13a of the conductive mounting board 53 by vapor-deposition, it is possible-not only to obtain the same effects as those obtained in the first embodiment, but also to easily form the insulating mounting board 54 at a low cost.

(Fifth Embodiment)

Figure 13:
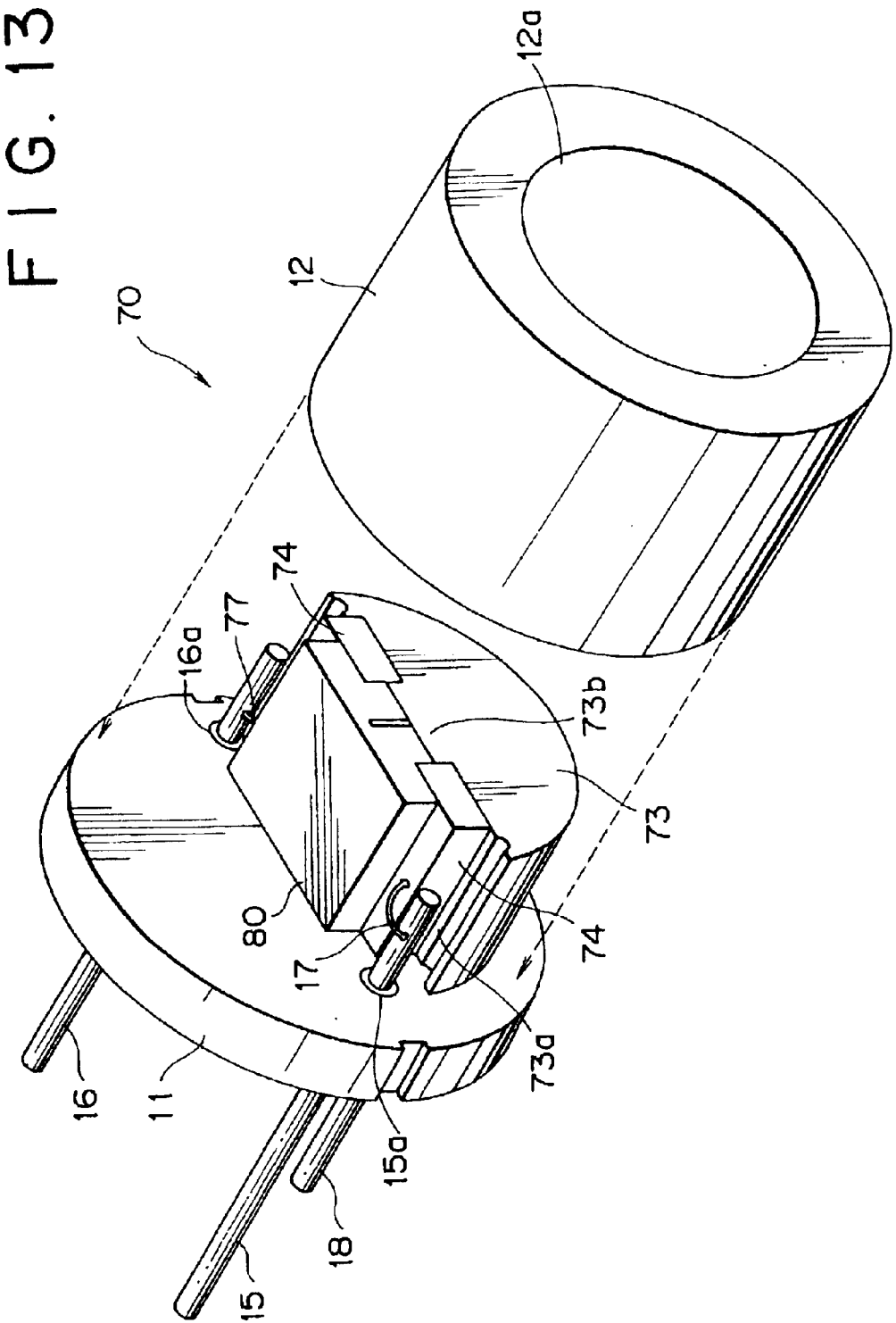
FIG. 13 is a partially exploded perspective view showing the entire configuration of a semiconductor light emitting device according to a fifth embodiment of the present invention.

FIG. 13 shows the entire configurations of a semiconductor light emitting device and a package 70 according to a fifth embodiment of the present invention. The semiconductor light emitting device and the package 70 in this embodiment have the same configurations as those described in the first embodiment, except that the configuration of a semiconductor laser 80 is different from that in the first embodiment and correspondingly the configurations of a conductive mounting board 73 and an insulating mounting board 74 are different from those in the first embodiment. In this embodiment, parts corresponding to those in the first embodiment are designated by the same reference numerals as those in the first embodiment, and the detailed description there of is omitted.

Figure 14:
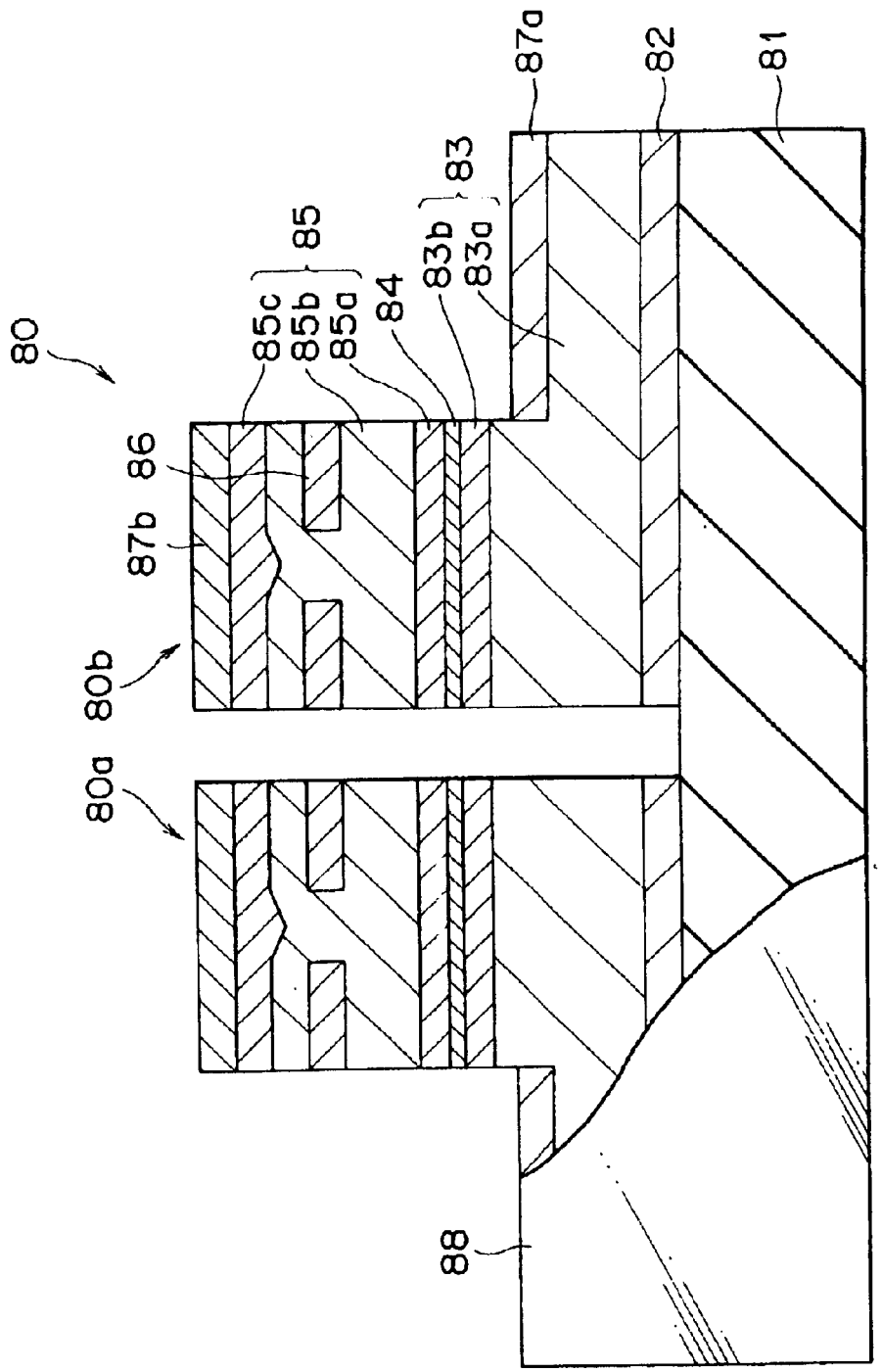
FIG. 14 is a partial sectional view showing a semiconductor laser of the semiconductor light emitting device shown in FIG. 13.

As enlargedly shown in FIG. 14, the semiconductor laser 80 has, on one surface of the same substrate 81, a plurality (two in this embodiment) of light emitting portions 80a and 80b arranged in the direction perpendicular to the resonator orientation. It should be noted that the resonator is oriented in the direction perpendicular to the paper plane in FIG. 14. The substrate 81, which has a thickness of about 100 μm, is made from semi-insulating GaAs. The light emitting portions 80a and 80b are formed on the (100) face of the substrate 81.

Each of the light emitting portions 80a and 80b having the same structure is formed by sequentially stacking a buffer layer 82, an n-type semiconductor layer 83 as a first conduction type semiconductor layer, an active layer 84, and a p-type semiconductor layer 85 as a second conduction type semiconductor layer on the substrate 81 in this order. The buffer layer 82, which has a thickness of 50 nm, is made from n-type GaAs doped with an n-type impurity such as silicon (Si) or selenium (Se), respectively.

The n-type semiconductor layer 83 is formed by stacking an n-type clad layer 83a and a first guide layer 83b on the buffer layer 82 in this order. The n-type clad layer 83a, which has a thickness of 1.0 μm, is made from a mixed crystal, n-type $Al_{0.40}Ga_{0.60}As$ doped with an n-type impurity such as silicon or selenium. The first guide layer 83b, which has a thickness of 10 nm, is made from a mixed crystal, n-type $Al_{0.17}Ga_{0.83}As$ doped with an n-type impurity such as silicon or selenium, respectively.

The active layer 84, which is made from a mixed crystal, undoped AlGaAs, has a multiple quantum well structure composed of a well layer having a thickness of 10 nm and made from $Al_{0.07}Ga_{0.93}As$ and a barrier layer having a thickness of 5 nm and made from $Al_{0.17}Ga_{0.83}As$. The active layer 84 in each of the light emitting portions 80a and 80b functions as a light emitting layer which emits light having a wavelength of about 790 nm, respectively.

The p-type semiconductor layer 85 is formed by sequentially stacking a second guide layer 85a, a p-type clad layer 85b and a cap layer 85c on the active layer 84 in this order. The second guide layer 85a, which has a thickness of 10 nm, is made from a mixed crystal, p-type $Al_{0.17}Ga_{0.83}As$ doped with a p-type impurity such as zinc (Zn). The p-type clad layer 85b, which has a thickness of 1.0 μm, is made from a mixed crystal, p-type $Al_{0.40}Ga_{0.60}As$ doped with a p-type impurity such as zinc. The cap layer 85c, which has a thickness of 50 nm, is made from p-type GaAs doped with a p-type impurity such as zinc, respectively.

Current block layers 86 extending along the resonator orientation are inserted in both sides of a portion of the p-type clad layer 85b in the stacking direction. To be more specific, the portion of the p-type clad layer 85b in the stacking direction has a narrow width in the direction perpendicular to the resonator orientation for the purpose of current constriction. Each current block layer 86, which has a thickness of 700 nm, and is made from n-type GaAs doped with an n-type impurity such as silicon or selenium, respectively.

Each of the light emitting portions 80a and 80b has an n-side electrode 87a as a first electrode on a portion, on the side where the active layer 84 is provided in the stacking direction, of the n-type clad layer 83a. The n-side electrode 87a is formed by sequentially stacking a gold-germanium (Ge) alloy layer, a nickel layer, and a gold layer on the n-type clad layer 83a in this order, and alloying the layers by heating. The n-side electrode 87a is electrically connected to the n-type clad layer 83a, respectively.

Each of the light emitting portions 80a and 80b has a p-side electrode 87b as a second electrode on a portion, on the side opposed to the active layer 84 of the cap layer 85c. The p-side electrode 87b is formed by stacking a titanium layer, a platinum (Pt) layer, and a gold layer on the cap layer 85c in this order, and alloying the layers by heating. The p-side electrode 87b is electrically connected to the cap layer 85c, respectively.

The reason why the n-side electrode 87a and the p-side electrode 87b are formed on the same side in the stacking direction is that the distance between each electrode and the active layer 84 is shortened to make the responsivity of each of the light emitting portions 80a and 80b enhanced. Further, in the light emitting portions 80a and 80b, the two p-side electrodes 87b are adjacent to each other, and the two n-side electrodes 87a are disposed in such a manner as to provide the two p-side electrodes 87b therebetween.

Each of the light emitting portions 80a and 80b has a pair of reflector films 88 (only one is shown in FIG. 14) at end portions in the resonator orientation. One reflector film 88, having a low reflectance, is made from aluminum oxide $(Al_2O_3)$. The other reflector film (not shown), having a high reflectance, is formed by alternately stacking aluminum oxide layers and amorphous silicon layers. Light generated from the active layer 84 is reciprocated between the pair of reflector films 88 to be amplified, and is emitted from one reflector film 88 as a laser beam.

As shown in FIG. 13, a conductive mounting board 73 of the package 70 has on its mounting surface a pair of recessed portions 73a and one projecting portion 73b provided therebetween. The pair of recessed portions 73a are formed correspondingly to the n-side electrodes 87a of the semiconductor laser 80, and the projecting portion 73b is formed correspondingly to the p-side electrodes 87b of the semiconductor laser 80. The size of each recessed portion 73a is set such that the width is 0.2 mm and the depth is 1 mm, and the size of the projecting portion 73b is set such that the width is 0.4 mm and the depth is 1 mm. A difference in height between the mounting surfaces of the recessed portion 73a and the projecting portion 73b is 300 μm. The sizes of each of recessed portions 73a may be different from each other, however, they are preferably identical to each other in order to reduce the number of kinds of insulating mounting boards 74 to be mounted on the recessed portions 73a, thereby improving the productivity. The other configuration of the conductive mounting board 73 is the same as that of the conductive mounting board 13 in the first embodiment.

The insulating mounting board 74 of the package 70 is disposed on each of the pair of the recessed portions 73a of the conductive mounting board 73. While not shown, like the insulating mounting board 14 in the first embodiment, the insulating mounting board 74 has an insulating board made from an insulating material; an adhesive layer formed on the surface, on the conductive mounting board 74 side, of the insulating board; a wiring portion formed on the surface, opposed to the conductive mounting board 73, of the insulating board; and a solder adhesive layer formed on a portion of the surface, opposed to the insulating board, of the wiring portion. The configuration of the insulating mounting board 74 is the same as that of the insulating mounting board 14 in the first embodiment. The size of the insulating mounting board 74 is set such that the width is 0.2 mm and the depth is 1 mm. The thickness of the insulating mounting board 74 is the same as that of the insulating mounting board 14 in the first embodiment.

The wiring portion of one insulating mounting board 74 is connected to a pin 15 by means of a wire 17, and the wiring portion of the other insulating mounting board 74 is connected to a pin 16 by means of a wire 77. The semiconductor laser 80 is disposed such that n-side electrodes 87a are in contact with the solder adhesive layers of the insulating mounting boards 74 and the p-side electrodes 87b are in contact with the projecting portion 73b of the conductive mounting board 73. That is to say, the n-side electrode 87a of the light emitting portion 80a is connected to a power source (not shown) from the pin 16 by way of the wiring portion provided on the insulating mounting board 74 and the wire 77, and the n-side electrode 87a of the light emitting portion 80b is connected to a power source (not shown) from the pin 15 by way of the wiring portion provided on the insulating mounting board 74 and the wire 17. On the other hand, the p-side electrodes 87b of the light emitting portions 80a and 80b are connected to a power source (not shown) from the pin 18 by way of the conductive mounting board 73, respectively.

In this embodiment, since each p-side electrode 87b including the active layer 84 between the substrate 81 and the same is in contact with the conductive mounting board 73 like the first embodiment, it is possible to positively radiate heat generated in each active layer 84 via the conductive mounting board 73.

The semiconductor light emitting device and the package 70 having the above configurations are fabricated in the following procedure:

First, the semiconductor laser 80 is fabricated as follows: A substrate 81 made from semi-insulating GaAs and having a plurality of semiconductor laser formation regions is prepared. A buffer layer 82 made from n-type GaAs; an n-type clad layer 83a made from a mixed crystal, n-type $Al_{0.40}Ga_{0.60}As$; a first guide layer 83b made from a mixed crystal, n-type $Al_{0.17}Ga_{0.83}As$; an active layer 84 made from a mixed crystal, undoped AlGaAs; a second guide layer 85a made from a mixed crystal, p-type $Al_{0.17}Ga_{0.83}As$; and part of a p-type clad layer 85b made from a mixed crystal, p-type $Al_{0.40}Ga_{0.60}As$ are allowed to sequentially grow on one surface (100 face) of the substrate 81 by MOCVD.

A current block layer 86 made from n-type GaAs is allowed to selectively grow on the p-type clad layer 85b by MOCVD. After selectively growing the current block layer 86, the remainder of the p-type clad layer 85b made from a mixed crystal, p-type $Al_{0.40}Ga_{0.60}As$ and a cap layer 85c made from p-type GaAs are allowed to sequentially grow on the current block layer 86 and the p-type clad layer 85b by MOCVD.

After forming the layers up to the cap layer 85c, the cap layer 85c, the current block layer 86, the p-type clad layer 85b, the second guide layer 85a, the active layer 84, the first guide layer 83b, the n-type clad layer 83a, and the buffer layer 82 are selectively removed in sequence correspondingly to formation positions of light emitting portions 80a and 80b by lithography, to separate the light emitting portions 80a and 80b from each other.

After separating the light emitting portions 80a and 80b from each other, the cap layer 85c, the current block layer 86, the p-type clad layer 85b, the second guide layer 85a, the active layer 84, the first guide layer 83b, and part of the n-type clad layer 83a are selectively removed in sequence correspondingly to formation positions of n-side electrodes 87a in the light emitting portions 80a and 80b by lithography, to expose the n-type clad layers 83a in the light emitting portions 80a and 80b. Then, the n-side electrode 87a is selectively formed on each n-type clad layer 83a, and then a p-side electrode 87b is selectively formed on each cap layer 85c. After that, the n-side electrodes 87a and the p-side electrodes 87b in the light emitting portions 80a and 80b are each alloyed by heating.

After forming the n-side electrodes 87a and the p-side electrodes 87b, the substrate 81 is divided in the direction perpendicular to the resonator orientation into parts each having a specific length corresponding to the length of each semiconductor laser formation region. A pair of reflector films 88 are formed on a pair of side surfaces of the divided part by CVD. Then, the substrate 81 of each part is divided in the direction parallel to the resonator orientation into parts each having a specific width corresponding to the width of each semiconductor laser formation region. In this way, the semiconductor laser 80 is obtained.

Next, like the first embodiment, a support 11 and a conductive mounting board 73 are integrally cast, and a solder film is vapor-deposited on the surfaces of the support 11 and the conductive mounting board 73. Pins 15, 16 and 18 separately formed are disposed on the support 11. Subsequently, like the first embodiment, insulating mounting boards 74 are separately formed.

After forming the insulating mounting boards 74, like the first embodiment, the insulating mounting board 74 is mounted on a recessed portion 73a of each conductive mounting board 73, and each p-side electrode 87b of the semiconductor laser 80 is brought into contact with a projecting portion 73b of the conductive mounting board 73 and each n-side electrode 87a is brought into contact with a solder adhesive layer of each insulating mounting board 74. The assembly is heated by a heating apparatus (not shown), so that a solder film of the conductive mounting board 73 is melted to adhesively bond each insulating mounting board 74 to the conductive mounting board 73 and to adhesively bond each p-side electrode 87b of the semiconductor laser 80 to the conductive mounting board 73. Besides, the solder adhesive layer of each insulating mounting board 74 is melted to adhesively bond each n-side electrode 87a of the semiconductor laser 80 to each insulating mounting board 74.

After that, a wire 17 is laid out to connect a wiring portion of one insulating mounting board 74 to the pin 15, and a wire 77 is laid out to connect a wiring portion of the other insulating mounting board 74 to the pin 16. After connecting the wires 17 and 77, like the first embodiment, a cover body 12 separately formed is disposed to the support 11. In this way, the semiconductor light emitting device and the package 70 shown in FIG. 13 are formed.

The functions of the semiconductor light emitting device and the package 70 thus formed will be described below.

In this semiconductor light emitting device, when a specific voltage is applied to between each n-side electrode 87a and the associated p-side electrode 87b of the semiconductor laser 80 via the pins 15, 16 and 18 of the package 70, a current is injected in the associated active layer 84 of the semiconductor laser 80, to cause light emission by recombination of electrons with positive holes. Light thus generated is reciprocated between the pair of reflector films 88 to be amplified, and is emitted from one reflector film 88 as a laser beam. The laser beam thus emitted from the semiconductor laser 80 is extracted outwardly from the package 70 via an extraction window 12a of the package 70.

At this time, in the semiconductor laser 80, heat generation occurs mainly at the active layer 84 of each of the light emitting portions 80a and 80b. In this embodiment, since each p-side electrode 87b is directly connected to the conductive mounting board 73 and thereby the distance between each active layer 84 and the conductive mounting board 73 is shortened, and thus heat generated in each active layer 84 is positively radiated via the conductive mounting board 73. Accordingly, it is possible to suppress thermal interference between the light emitting portions 80a and 80b of the semiconductor laser 80, and hence to suppress an increase in threshold current and also suppress a reduction in luminous efficiency.

In this embodiment, since the insulating mounting board 74 is disposed on each recessed portion 73a of the conductive mounting board 73 and each n-side electrode 87a is electrically connected to the wiring portion provided on the insulating mounting board 74, it is possible to ensure electrical insulation between the conductive mounting board 73 and the wiring portion, and hence to prevent short-circuit between the n-side electrode 87a and the p-side electrode 87b. In addition, it is possible to ensure electrical insulation between the wiring portions provided on both the insulating mounting board 74, and to ensure independent drive of the light emitting portions 80a and 80b.

In this way, according to the semiconductor light emitting device in this embodiment, since each p-side electrode 87b is directly connected to the conductive mounting board 73, the distance between each active layer 84 and the conductive mounting board 73 can be shortened to thereby positively radiate heat generated in the active layer 84 via the conductive mounting board 73. As a result, it is possible to suppress thermal interference between the light emitting portions 80a and 80b. That is to say, it is possible to suppress an increase in threshold current and a reduction in luminous efficiency, and hence to maintain a high quality of the device for a long-period of time.

Also since the insulating mounting board 74 is disposed on each recessed portion 73a of the conductive mounting board 73 and each n-side electrode 87a is connected to the wiring portion provided on the insulating mounting board 74, it is possible to ensure electrical insulation between each wiring portion and the conductive mounting board 73, and hence to prevent short-circuit between each n-side electrode 87a and the associated p-side electrode 87b of the semiconductor laser 80. Further, it is possible to ensure electrical insulation between the wiring portions for the light emitting portions 80a and 80b, and hence to ensure independent drive of the light emitting portions 80a and 80b.

According to the package 70 in this embodiment, since the two recessed portions 73a and the projecting portion 73b are formed on the conductive mounting board 73, and the insulating mounting board 74 is disposed on each recessed portion 73a, it is possible to prevent short-circuit between each n-side electrode 87a and the associated p-side electrode 87b of the semiconductor laser 80 by disposing the n-side electrode 87a on the wiring portion provided on the insulating mounting board 74 and disposing the associated p-side electrode 87b on the conductive mounting board 73. Also it is possible to ensure electrical insulation between both the n-side electrodes 87a provided in the light emitting portions 80a and 80b and hence to ensure independent drive of the light emitting portions 80a and 80b. Further, it is possible to positively radiate heat generated in each active layer of the semiconductor laser 80 via the conductive mounting board 13.

Although not described in detail, the semiconductor light emitting device in this embodiment may be configured such that the same separating portion as that in the second embodiment is provided on the conductive mounting board 73. Besides, the same position fixing portion as that in the third embodiment may be provided on the conductive mounting board 73; and the insulating mounting board 74 may be formed on each recessed portion 73a of the conductive mounting board 73 by deposition, like the fourth embodiment.

(Sixth Embodiment)

Figure 15:
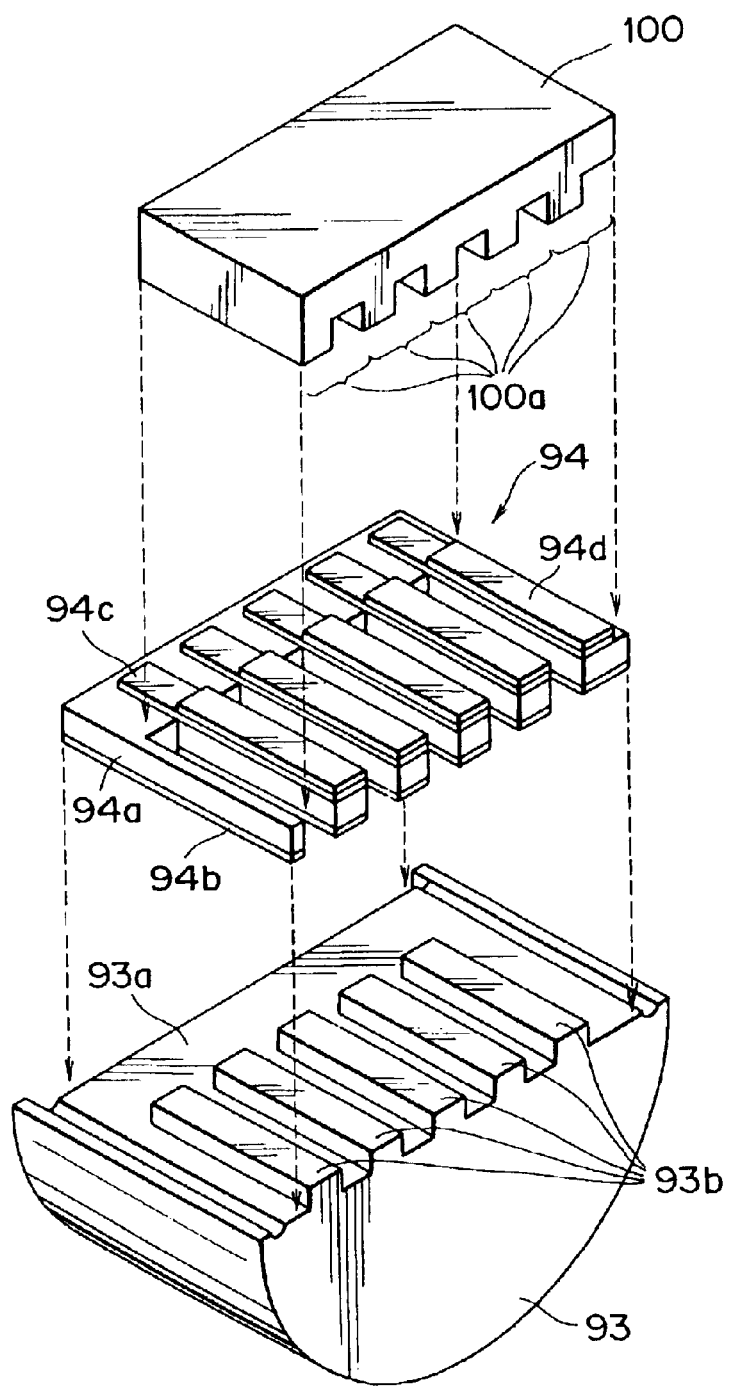
FIG. 15 is an exploded perspective view of a portion of a semiconductor light emitting device according to a sixth embodiment of the present invention.

FIG. 15 shows a portion of a semiconductor light emitting device and a portion of a package according to a sixth embodiment of the present invention. The semiconductor light emitting device and the package in this embodiment have the same configurations and functions as those in the fifth embodiment, except that a semiconductor laser 100 has three or more light emitting portions 100a and correspondingly, the configurations of a conductive mounting board 93 and an insulating mounting board 94 are different from those in the fifth embodiment, and they can be fabricated in the same manner as that described in the fifth embodiment. Accordingly, in this embodiment, parts corresponding to those in the fifth embodiment are designated by the same reference numerals as those in the fifth embodiment, and the detailed explanation thereof is omitted.

The semiconductor laser 100 has, in this embodiment, five light emitting portions 100a each of which has the same configuration. In these light emitting portions 100a, n-side electrodes and p-side electrodes are formed so as to be alternately arranged. The other configuration of the semiconductor laser 100 is the same as that of the semiconductor laser 80 in the fifth embodiment.

The conductive-mounting board 93 has on its mounting surface five projecting portions 93b and recessed portions 93a formed to surround each projecting portion 93b in an U-shape. The recessed portions 93a are formed correspondingly to the n-side electrodes of the semiconductor laser 100, and the projecting portions 93b are formed correspondingly to the p-side electrodes of the semiconductor laser 100. The other configuration of the conductive mounting board 93 is the same as that of the conductive mounting board 73 described in the fifth embodiment.

The insulating mounting board 94, which is disposed on the recessed portions 93a of the conductive mounting board 93, has an insulating board 94a made from an insulating material and formed into a comb-shape corresponding to the recessed portions 93a of the conductive mounting board 93. An adhesive layer 94b is formed all over the surface, on the conductive mounting board 94 side, of the insulating board 94a. Wiring portions 94c, which are independent from each other correspondingly provided to the n-side electrodes of the semiconductor laser 100, are formed on the surface, opposed to the conductive mounting board 93, of the insulating board 94a. A solder adhesive layer 94d is formed on a portion of the surface, opposed to the insulating board 94a of each wiring portion 94c. The materials for forming the insulating board 94a, the adhesive layer 94b, each wiring portion 94d, and each solder adhesive layer 94d are the same as those used in the fifth embodiment. The thickness of the insulating mounting board 94 is the same as that in the fifth embodiment.

The semiconductor laser 100 is disposed such that each n-side electrode is in contact with the associated solder adhesive layer 94d of the insulating mounting board 94 and each p-side electrode is in contact with the associated projecting portion 73b of the conductive mounting board 73. While not shown, each wiring portion 94c of the insulating mounting board 94 is connected to different pins. That is to say, according to this embodiment, even the semiconductor laser having three or more light emitting portions 100a can exhibit the same effect as that in the fifth embodiment.

While not described in detail, the semiconductor light emitting device in this embodiment may be configured such that the same separating portion as that in the second embodiment may be provided on the conductive mounting board 93; the same position fixing portion as that in the third embodiment may be provided on the conductive mounting board 93; and the insulating mounting board 94 may be formed on the recessed portion 93a of the conductive mounting board 93 by deposition, like the fourth embodiment.

While the embodiments of the present invention have been described, the present invention is not limited thereto, and it is to be understood that various changes may be made with departing from the spirit or scope of the present invention. For example, although each of the conductive mounting boards 13, 33, 43, 53, 73, 93 is made from the metal, it may be made from a conductive material other than the metal.

In each of the first, second, third, fifth, and sixth embodiments, each of the insulating mounting boards 14, 74 and 94 is made from the insulating material such as aluminum nitride, boron nitride or silicon carbide, however, it may be made from a different insulating material such as silicon dioxide, silicon nitride ($Si_3N_4$), aluminum oxide ($Al_2O_3$), amorphous silicon, zirconium oxide (ZrO) or titanium oxide (TiO).

In the fourth embodiment, the insulating mounting board 54 is made from silicon dioxide, however, it may be made from a different insulating material such as aluminum nitride, boron nitride, silicon carbide, silicon nitride, aluminum oxide, amorphous silicon, zirconium oxide or titanium oxide.

Figure 16:
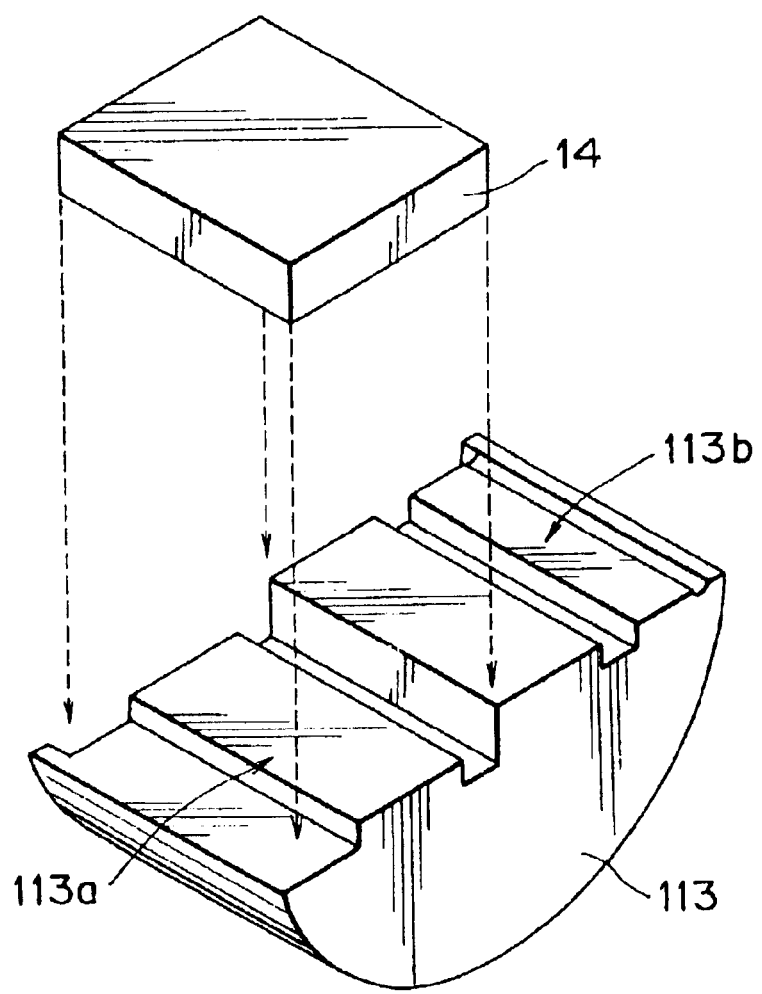
FIG. 16 is a perspective view showing a variation of the semiconductor device of the present invention.
Figure 17:
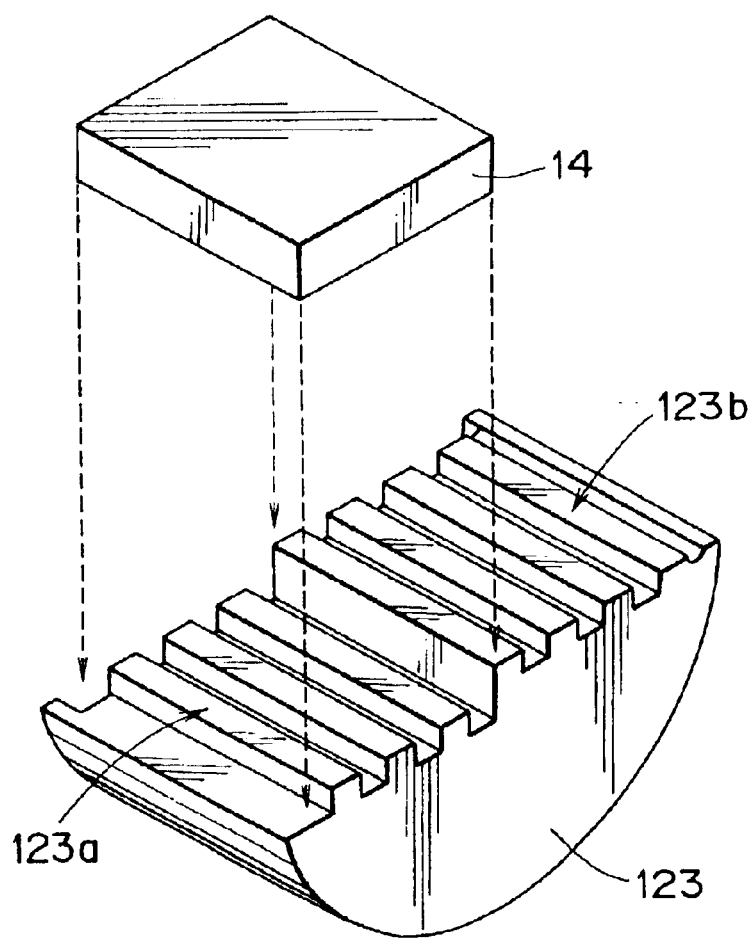
FIG. 17 is a perspective view showing another variation of the semiconductor device of the present invention.

In each of the embodiments, the recessed portions 13a, 73a and 93a and the projecting portions 13b, 73b and 93b of the conductive mounting boards 13, 33, 43, 53, 73 and 93 are each flattened, however, as shown in FIGS. 16 and 17, recessed portions 113a and 123a and projecting portions 113b and 123b of conductive mounting boards 113 and 123 may be each configured to have one or more recesses and one or more projections. However, each of a contact area between the conductive mounting board and the insulating mounting board and a contact area between the conductive mounting board and the semiconductor element may be made large for increasing the heat radiation effect.

In each of the embodiment, the first conduction type semiconductor layer is taken as the n-type semiconductor layer 25 or 83 and the second conduction type semiconductor layer is taken as the p-type semiconductor layer 27 or 85, however, the first conduction type semiconductor layer may be taken as a p-type semiconductor layer and the second conduction type semiconductor layer be taken as an n-type semiconductor layer. However, in the case where the crystallinity of the n-type semiconductor layer is superior to that of the p-type semiconductor layer, for example, in the case of a compound semiconductor composed of a nitride containing nitrogen and a group III element, it may be desirable that an n-type semiconductor layer, an active layer, and a p-type semiconductor layer sequentially grow on a substrate, in order to suitably obtain a desirable semiconductor light emitting element.

In each of the first to fourth embodiments, the compound semiconductor composed of the group III based nitride for forming each of the n-type semiconductor layer 25, the active layer 26, the p-type semiconductor layer 27, and the like of the semiconductor laser 20 is exemplarily described, however, according to the present invention, it may be replaced with a suitable compound semiconductor composed of a different group III based nitride containing nitrogen (N) and at least one kind of group III-element selected from the group consisting of gallium (Ga), aluminum (Al), boron (B) and indium (In).

Further, in each of the first to fourth embodiments, each of the n-type semiconductor layer 25, the active layer 26, the p-type semiconductor layer 27, and the like of the semiconductor laser 20 is made from the compound semiconductor composed of the group III based nitride, however, according to the present invention, the above layer may be made from a different semiconductor. However, it should be noted that the present invention is particularly effective to a semiconductor light emitting device in which a semiconductor element is configured such that the first electrode and the second electrode are positioned on the same side in the stacking direction, more specifically, in which the semiconductor element has the first conduction type semiconductor layer, the active layer, and the second conduction type semiconductor layer sequentially stacked, and the first electrode is positioned on the side, on the side where the active layer is provided, of the first conduction type semiconductor layer and the second electrode is positioned on the side, opposed to the active layer, of the second conduction type semiconductor layer.

In each of the fifth and sixth embodiments, the semiconductor for forming each of the n-type semiconductor layer 83, the active layer 84, the p-type semiconductor layer 85, and the like of each of the light emitting portions 80a, 80b and 100a is exemplarily described, however, according to the present invention, it may be replaced with a different semiconductor, for example, a group II–V compound semiconductor or a group II–VI compound semiconductor.

In each of the embodiments, the configuration of the semiconductor laser is exemplirily described, however, the present invention is not limited thereto. For example, the semiconductor laser of the present invention may be configured such that the deterioration preventive layer 27a may not be provided; each of the first guide layer 25c and 83b and the second guide layer 27b and 85a may be made from a undoped semiconductor; or the current constriction may be performed in a manner different from that described in the embodiments.

In each of the embodiments, the semiconductor device is configured as a semiconductor light emitting device including a semiconductor laser, however, the present invention is applicable to a semiconductor light emitting device including a different semiconductor light emitting element such as a light emitting diode, and also applicable to a semiconductor device including a semiconductor element other than the semiconductor light emitting device.

Additionally, in each of the embodiments, each of the first conduction type semiconductor layer, the active layer, the second conduction type semiconductor layer, and the like of each of the semiconductor lasers 20, 80 and 100 is formed by MOCVD, however, it may be formed by a different vapor-phase growth process such as a MBE process or a halide vapor-phase growth process, also called a hydride vapor-phase growth process, in which halogen contributes to transportation or reaction of a raw material.

(Seventh Embodiment)

Figure 18:
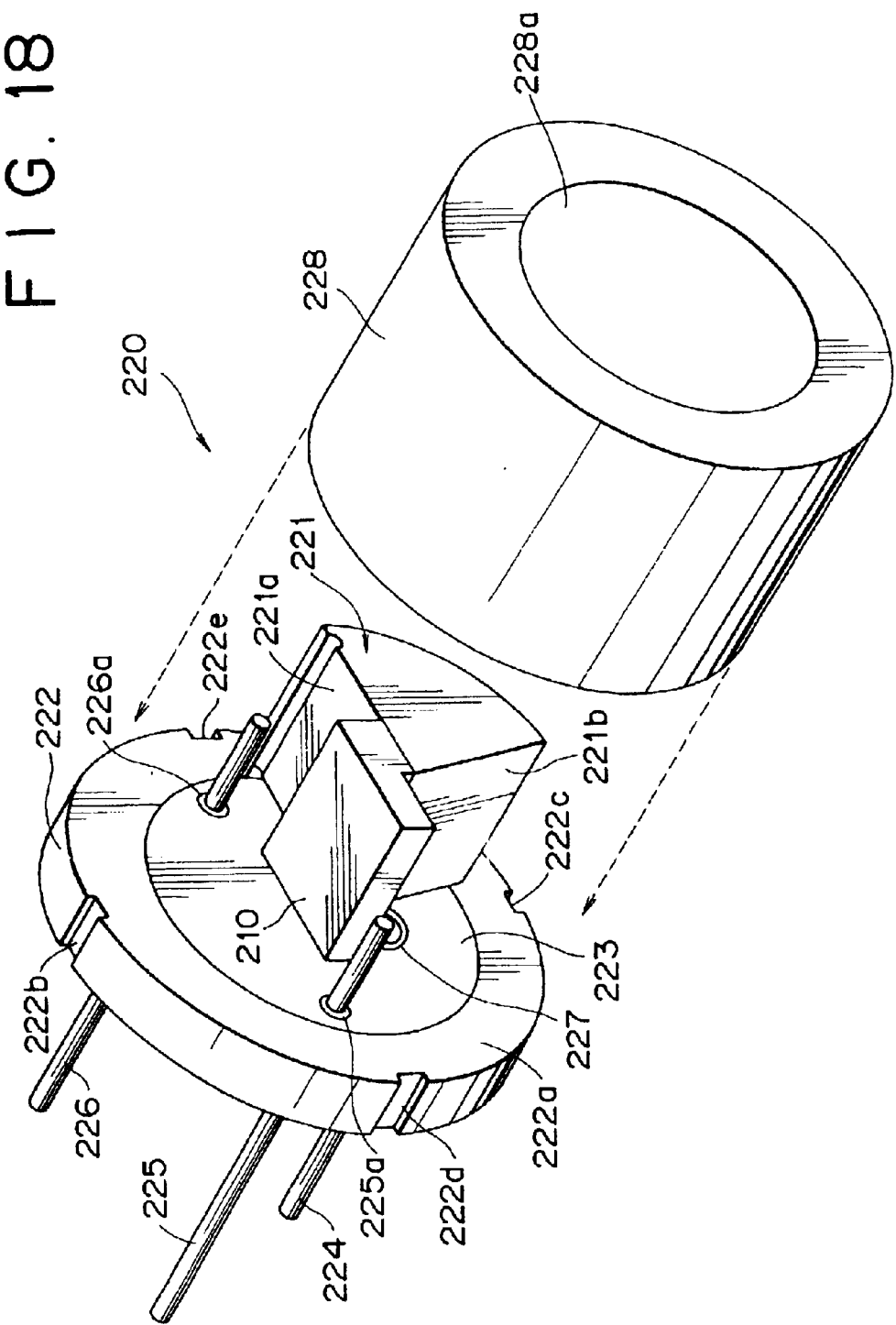
FIG. 18 is a partially exploded perspective view showing a configuration of a semiconductor light emitting device according to one embodiment of the present invention.

FIG. 18 shows the entire configuration of a semiconductor light emitting device as a semiconductor device according to one embodiment of the present invention. The semiconductor light emitting device includes a semiconductor laser 210 as a semiconductor element and a package 220 for containing the semiconductor laser 210.

Figure 19:
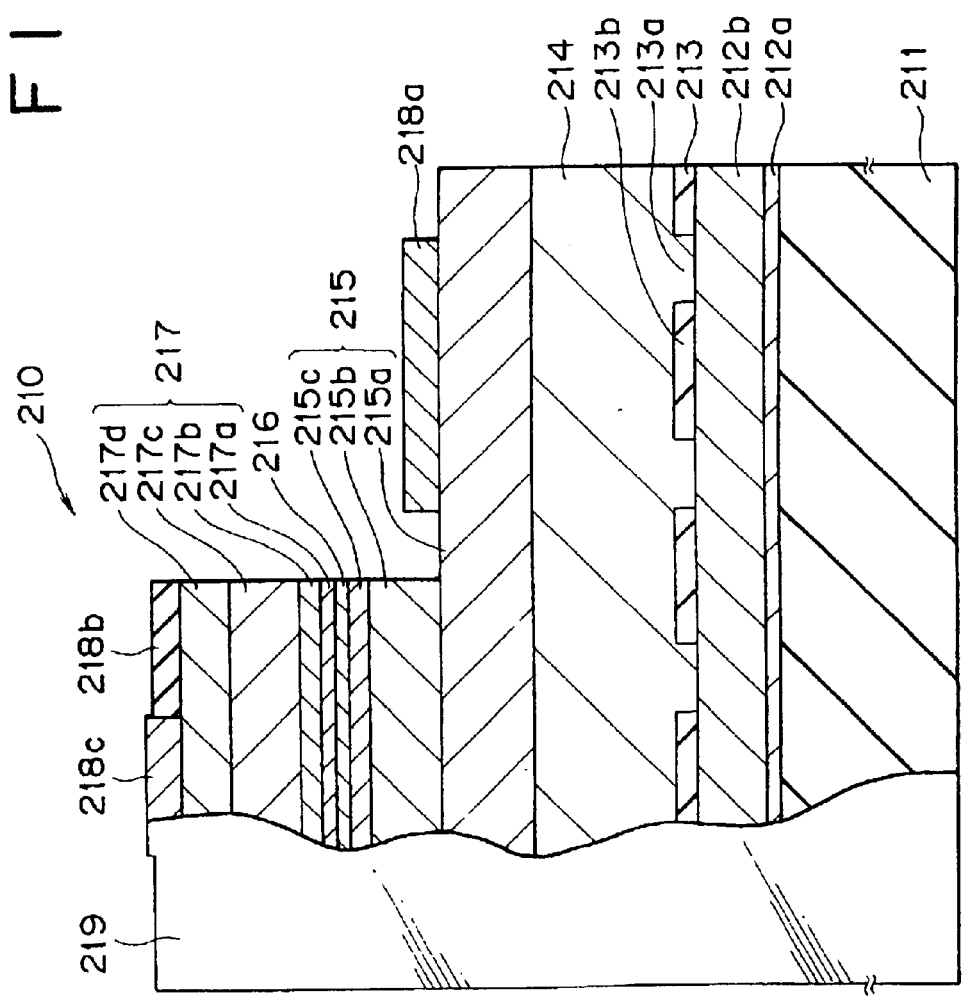
FIG. 19 is a partial sectional view of a semiconductor laser of the semiconductor light emitting device shown in FIG. 18.

FIG. 19 shows a partial cross-sectional structure of the semiconductor laser 210. The semiconductor laser 210 is formed by sequentially stacking a plurality of semiconductor layers on one surface of a pair of opposed surfaces of a substrate 211, via a buffer layer 212*a*, a backing layer 212*b*, a mask layer 213, and a coating growth layer 214. The plurality of semiconductor layers are composed of an n-type semiconductor layer 215 as a first conduction type semiconductor layer, an active layer 216, and a p-type semiconductor layer 217 as a second conduction type semiconductor layer, which are stacked on the substrate 211 in this order. The substrate 211 is formed of a sapphire having a thickness in the stacking direction (hereinafter, referred to simply as "thickness") of 300 $\mu$m, and the buffer layer 212*a* is formed on the C-face of the substrate 211.

The buffer layer 212*a*, which has a thickness of 30 nm, is made from an undoped GaN. The backing layer 212*b*, which has a thickness of 2 $\mu$m, is made from a crystal of undoped GaN. The mask layer 213, which has a thickness of 0.1 $\mu$m, is made from silicon dioxide ($SiO_2$). The mask layer 213 has a plurality of stripe-shaped openings 213*a* extending in the direction perpendicular to the paper plane in FIG. 19, and a plurality of stripe-shaped mask portions 213*b* each formed between adjacent two of the openings 213*a*. The coating growth layer 214 grows laterally on the mask layer 213, to thereby cutoff penetration of dislocations from the backing layer 212*b*. The coating growth layer 214, which has a thickness of 10 $\mu$m, is made from undoped GaN.

The n-type semiconductor layer 215 is formed by stacking an n-side contact layer 215*a*, an n-type clad layer 215*b*, and a first guide layer 215*c* on the coating growth layer 214 in this order. The n-side contact layer 215*a*, which has a thickness of 3 $\mu$m, is made from n-type GaN doped with an n-type impurity such as silicon (Si). The n-type clad layer 215*b*, which has a thickness of 1 $\mu$m, is made from a mixed crystal, n-type $Al_{0.01}Ga_{0.9}N$ doped with an n-type impurity such as silicon. The first guide layer 215*c*, which has a thickness of 0.1 $\mu$m, is made from n-type GaN doped with an n-type impurity such as silicon.

The active layer 216 is made from a mixed crystal, undoped InGaN, and has a multiple quantum well structure including a well layer having a thickness of 3 nm and made from a mixed crystal, $In_{0.15}Ga_{0.85}N$, and a barrier layer having a thickness of 7 nm and made from a mixed crystal, $In_{0.02}Ga_{0.98}N$. The active layer 216 functions as a light emitting layer. For example, upon laser oscillation, the emission wavelength is set at about 405 nm.

The p-type semiconductor layer 217 is formed by stacking a deterioration preventive layer 217*a*, a second guide layer 217*b*, a p-type clad layer 217*c*, and a p-side contact layer 217*d* on the active layer 216 in this order. The deterioration preventive layer 217*a*, which has a thickness of 20 nm, is made from a mixed crystal, p-type $Al_{0.2}Ga_{0.8}N$ doped with a p-type impurity such as magnesium (Mg). The second guide layer 217*b*, which has a thickness of 0.1 $\mu$m, is made from p-type GaN doped with a p-type impurity such as magnesium. The p-type clad layer 217*c*, which has a thickness of 0.8 $\mu$m, is made from a mixed crystal, p-type $Al_{0.1}Ga_{0.9}N$ doped with a p-type impurity such as magnesium. The p-side contact layer 217*d*, which has a thickness of 0.1 $\mu$m, is made from a mixed crystal, p-type GaN doped with a p-type impurity such as magnesium.

An n-side electrode 218*a* as a first electrode is provided on the surface, on the p-type semiconductor layer 217 side in the stacking direction, of the n-side contact layer 215*a*. An insulating layer 218*b* made from silicon dioxide is formed on the side, opposed to the n-type semiconductor layer 215 in the stacking direction, of the p-side contact layer 217*d*, and a p-side electrode 218*c* as a second electrode is provided on the p-side contact layer 217*d* through an opening formed in the insulating layer 218*b*. That is to say, in the semiconductor laser 210, the n-side electrode 218*a* and the p-side electrode 218*c* are formed on the same side in the stacking direction.

The n-side electrode 218*a* is formed by stacking a titanium (Ti) layer, an aluminum (Al) layer, a platinum (Pt) layer, and a gold (Au) layer on the n-side contact layer 215*a* in this order and alloying these metals by heating, to be thus electrically connected to the n-side contact layer 215*a*. The p-side electrode 218*c* is formed by stacking a nickel (Ni) layer, a platinum layer and a gold layer on the p-side contact layer 217*d* in this order and alloying these metals by heating, to be thus electrically connected to the p-side contact layer 217*d*. The p-side electrode 218*c* is formed into a stripe shape extending in the direction perpendicular to the paper plane in FIG. 19 for current constriction, and a region of the active layer 216 corresponding to the p-side electrode 218*c* becomes a light emission region.

The semiconductor laser 210 has a pair of reflector films 219 (only one is shown in FIG. 19) at both ends of the p-side electrode 218*c* in the length direction. Each reflector film 219 is formed by alternately stacking silicon dioxide films and zirconium oxide ($ZrO_2$) films. The reflectance of one reflector film 219 is set at a low value and the reflectance of the other reflector film (not shown) is set at a high value, so that light generated from the active layer 216 is reciprocated between the pair of reflector films 219 to be amplified, and is emitted from one reflector film 219 as a laser beam. That is to say, the length direction of the p-side electrode 218*c* becomes the resonator orientation.

Figure 20:
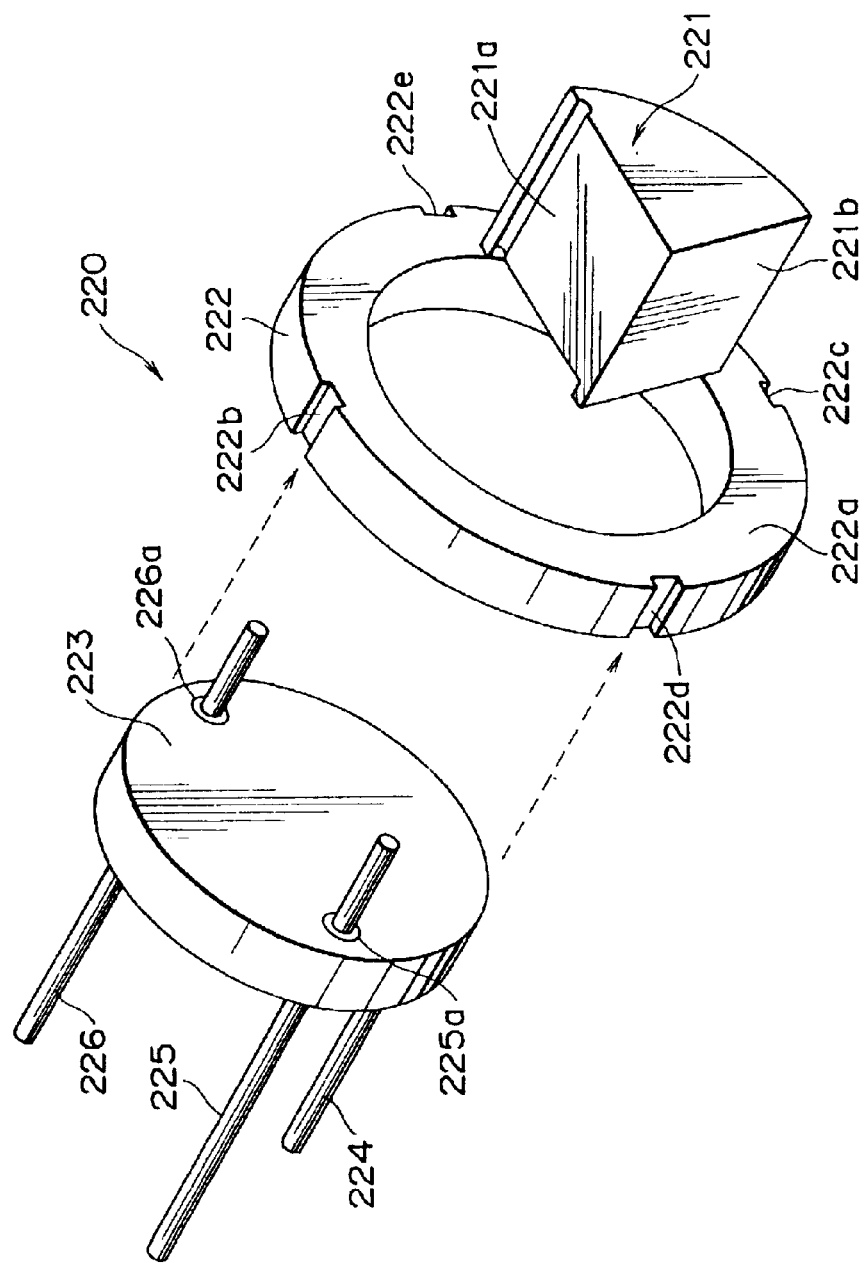
FIG. 20 is a partial exploded perspective view of a portion of a package of the semiconductor light emitting device shown in FIG. 18.

FIG. 20 is an exploded view of a portion of the package 220. The package 220 includes a conductive mounting board 221 for supporting the semiconductor laser 210 and radiating heat generated in the semiconductor laser 210; and a support 222, formed into a circular ring shape, for supporting the conductive mounting board 221 by a supporting surface 222*a*.

The conductive mounting board 221 has a mounting surface 221*a* on which the semiconductor laser 210 is to be disposed. The mounting surface 221*a* is perpendicular to the supporting surface 222*a*. As shown in FIG. 18, of the n-side electrode 218*a* and the p-side electrode 218*c* of the semiconductor laser 210, the p-side electrode 218*c* (including the insulating layer 218*b*) is fixed on the mounting surface 221*a*. Specifically, the conductive mounting board 221 supports the semiconductor laser 210 in a state in which the n-side electrode 218*a* projects from the conductive mounting board 221 in the direction parallel to the mounting surface 221a and the supporting surface 222a. The reason why the p-side electrode 218c is in contact with the conductive mounting board 221 is that the active layer 216 as a main heat generation source is located between the p-side electrode 218c and the substrate 211. That is to say, by shortening the distance between the active layer 216 and the conductive mounting board 221 having a high heat radiation effect, it is possible to effectively radiate heat generated in the active layer 216 via the conductive mounting board 221.

When the mounting surface 221a of the conductive mounting board 221 is located in such a manner as to extend in the horizontal direction, that is, to be directed upwardly, the conductive mounting board 221 is shifted rightwardly, downwardly from the center of the supporting surface 222a of the support 222. The reason for this is that even if the semiconductor laser 210 is disposed on the conductive mounting board 221 with the n-side electrode 218a projecting therefrom, the semiconductor laser 210 is located at the central portion of the support 222. The conductive mounting board 221 has a side surface 221b at an end portion, near the center of the support 222, in the direction parallel to the mounting surface 221a and the supporting surface 222a. That is to say, the conductive mounting board 221 has the side surface 221b on the side on which the n-side electrode 218a of the semiconductor laser 210 projects. The side surface 221b is tilted, from the mounting surface 221a side to the opposed side, toward the opposed end of the mounting surface 221a, that is, toward the p-side electrode 218c side. The reason for this is to, as will be apparent in the description of the fabrication steps, easily connect a wire 227 to the n-side electrode 218a of the semiconductor laser 210.

Figure 21:
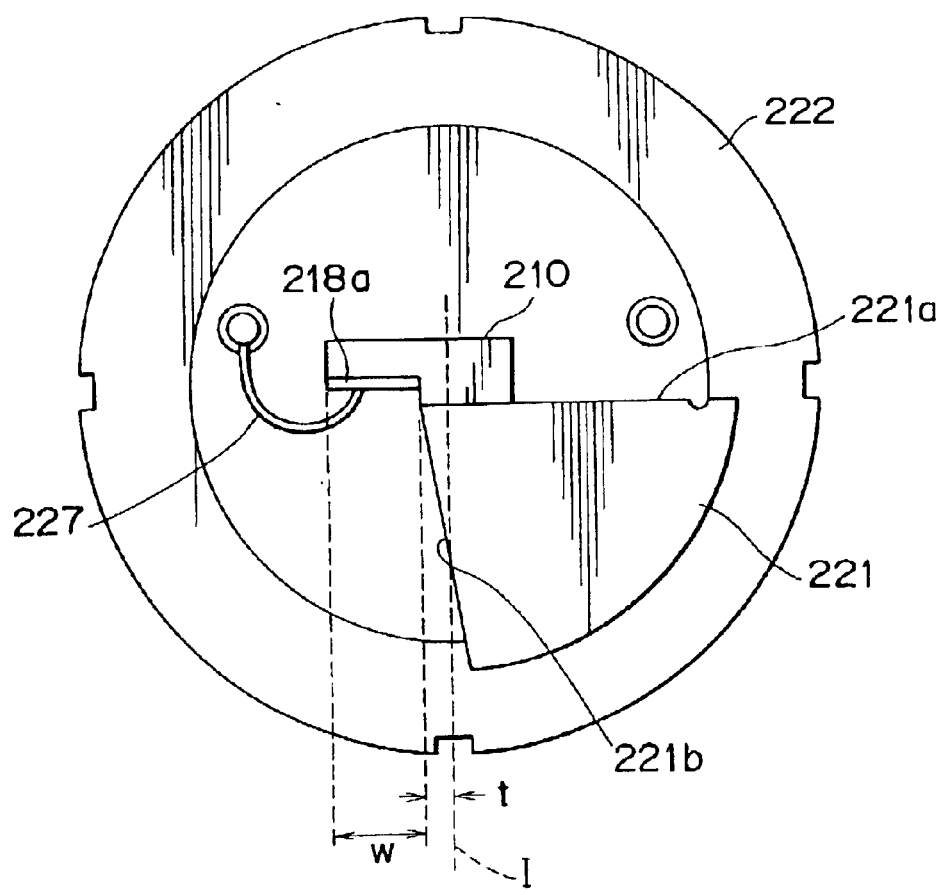
FIG. 21 is a front view illustrating the positional relationship between a conductive mounting board and a semiconductor laser.

As shown in FIG. 21, the end, on the side surface 221b side, of the mounting surface 221a may be desired to project leftwardly from a center perpendicular line I of the support 222 when the mounting surface 221a is directed upwardly, in order to locate the light emitting region of the active layer 216 of the semiconductor laser 210 at the center of the support 222. Further, a width "w" between the end, on the side surface 221b side, of the mounting surface 221a and the end, opposed to the side surface 221b, of the n-side electrode 218a is limited depending on the size of a capillary (not shown) used for connection of the wire 227 in the fabrication steps to be described later. Here, the distance "t" between the center perpendicular line I of the support 222 and the end, on the side surface 221b side, of the mounting surface 221a when the mounting surface 221a is directed upwardly is set at about 50 μm, and the above width "w" is set at about 300 μm.

As shown in FIG. 20, one of a pair of opposed side surfaces of the support 222 is taken as the support surface 222a. The outer peripheral surface of the support 222 has a plurality of fixing grooves 222b, 22c, 22d and 22e. The fixing groove 222b is adapted to fix the conductive mounting board 221 with the mounting surface 221a directed downwardly in the fabrication steps to be described later. The fixing groove 222c is adapted to fix the conductive mounting board 221 with the mounting surface 221a directed upwardly. The fixing grooves 222d and 222e are used for disposing the package 220.

The conductive mounting board 221 and the support 222 are integrally cast from a metal such copper (Cu), and a thin film made from nickel is formed on the surfaces of the conductive mounting board 221 and the support 222. A solder film (not shown) made from a solder material and having a thickness of 4 to 6 μm is formed on the mounting surface 221a of the conductive mounting board 221. Specific examples of the solder materials may include tin (Sn), lead (Pb), a tin-lead alloy, a gold-tin alloy, an indium (In)-tin alloy, and an indium-lead alloy.

A disk member 223 is mounted on the inner peripheral surface of the support 222. A pin 224 is formed on one surface, opposed to the conductive mounting board 221, of a pair of side surfaces of the disk member 223. The pin 224 is electrically connected to a power source (not shown) and is also electrically connected to the conductive mounting board 221. Specifically, the p-side electrode 218c of the semiconductor laser 210 is electrically connected to the power source (not shown) by means of the pin 224 via the conductive mounting board 221. In addition, the disk member 223 and the pin 224 are integrally cast from a metal such as an iron (Fe) based metal. The reason why the disk member 223 is separated from the support 222 is to facilitate the work of forming the solder film on the mounting surface 221a of the conductive mounting board 221 and hence to improve the productivity.

A pair of pins 225 and 226 to be electrically connected to power sources (not shown) are provided on the disk member 223 in such a manner as to pass through the disk member 223 from one side surface to the other side surface thereof. Each of the pins 225 and 226 is made from a metal such as copper, on the surface of which a thin film made from gold is formed. Insulating rings 225a and 226a made from glass are inserted between the disk member 223 and the pins 225 and 226, respectively, for electrically insulating the disk member 223 from the pins 225 and 226. In other words, the conductive mounting board 221 is electrically insulated from the pins 225 and 226.

One end of a wire 227 made from gold and having a thickness of 30 μm is connected to the pin 225, and the other end of the wire 227 is connected to the n-side electrode 218a of the semiconductor laser 210. That is to say, the n-side electrode 218a is electrically connected to the power source (not shown) by means of the pin 225 via the wire 227.

As shown in FIG. 18, a hollowed cylinder shaped cover body 228 for covering the semiconductor laser 210 and the conductive mounting board 221 is mounted on the supporting surface 222a of the support 222. The cover body 228 is provided for preventing both contamination and oxidation due to atmospheric air of the semiconductor laser 210 and for preventing whisker-like growth of solder on the mounting surface 221a of the conductive mounting board 221. The cover body 228 is made from a metal such as a copper or iron based metal. One end portion of the cover body 228 is opened and is in contact with the supporting surface 222a of the support 222, and the other end portion of the cover body 228 is closed and has an extraction window 228a for extracting a laser beam emitted from the semiconductor laser 210 contained in the cover body 228 outwardly from the package 220. The extraction window 228a is made from a material allowing transmission of a laser beam emitted from the semiconductor laser 210, for example, glass or plastic. In addition, a reflection preventive film for preventing reflection of a laser beam emitted from the semiconductor laser 210 is preferably formed on the extraction window 228a in order to prevent degradation of the characteristic thereof and occurrence of stray light.

The semiconductor device having the above configurations is fabricated in accordance with the following procedure:

First, a semiconductor laser 210 is formed as follows: A substrate 211 made from a sapphire having a plurality of semiconductor laser formation regions is prepared. A buffer layer 212a made from undoped GaN and a backing layer 212b made from undoped GaN are allowed to sequentially grow on one surface (C-face) of the substrate 211 by MOCVD (Metal Organic Chemical Vapor Deposition). Then, a silicon dioxide layer is formed on the backing layer 212b by an electron beam evaporation process and is patterned by lithography to selectively form a mask layer 213 having a plurality of stripe-shaped mask portions 13b. A coating growth layer 214 made from undoped GaN is allowed to selectively grow in the lateral direction from the openings 13a on the mask layer 213 by MOCVD.

Then, an n-side contact layer 215a made from n-type GaN, an n-type clad layer 215b made from n-type $Al_{0.1}Ga_{0.9}N$ (mixed crystal), a first guide layer 215c made from n-type GaN, an active layer 216 made from undoped GaInN (mixed crystal), a deterioration preventive layer 217a made from p-type $Al_{0.2}Ga_{0.8}N$ (mixed crystal), a second guide layer 217b made from p-type GaN, a p-type clad layer 217c made from p-type $Al_{0.1}Ga_{0.9}N$ (mixed crystal), and a p-side contact layer 217d made from p-type GaN are allowed to sequentially to grow on the coating growth layer 214 by MOCVD.

After growth of the layers in the order from the n-side contact layer 215a to the p-side contact layer 17d, it may be desirable to activate carriers by heating in a nitrogen ($N_2$) atmosphere at a temperature ranging from 800 to 900° C. as needed. Then, an insulating layer 218b made from silicon dioxide is formed on the p-side contact layer 217d by electron beam evaporation. Next, the insulating layer 218b, the p-side contact layer 217d, the p-type clad layer 217c, the second guide layer 217b, the deterioration preventive layer 217a, the active layer 216, the first guide layer 215c, and the n-type clad layer 215b are selectively removed in sequence correspondingly to a formation position of an n-side electrode 218a by lithography and RIE (Reactive Ion Etching), to expose the n-side contact layer 215a.

After exposure of the n-side contact layer 215a, the n-side electrode 218a is selectively formed on the n-side contact layer 215a by lift-off and electron beam evaporation. After forming the n-side contact layer 215a, the insulating layer 218b is selectively removed correspondingly to a formation position of a p-side electrode 218c by lithography. Then, the p-side electrode 218c is selectively formed on the p-side contact layer 217d by lift-off and electron beam evaporation. The n-side electrode 218a and the p-side electrode 218c are each alloyed by heating.

After heat-treatment, lapping is made to make thin the thickness of the substrate 211. The substrate 211 is then divided, in the direction perpendicular to the length direction of the p-side electrode 218c, into parts each having a specific length corresponding to that of each semiconductor laser formation region. A pair of reflector films 219 are formed on a pair of side surfaces of the divided part by electron beam evaporation. Then, the substrate 211 is divided, in the direction parallel to the length direction of the p-side electrode 218c, into parts having a specific width corresponding to that of each semiconductor laser formation region, to form a semiconductor laser 210.

Figure 22:
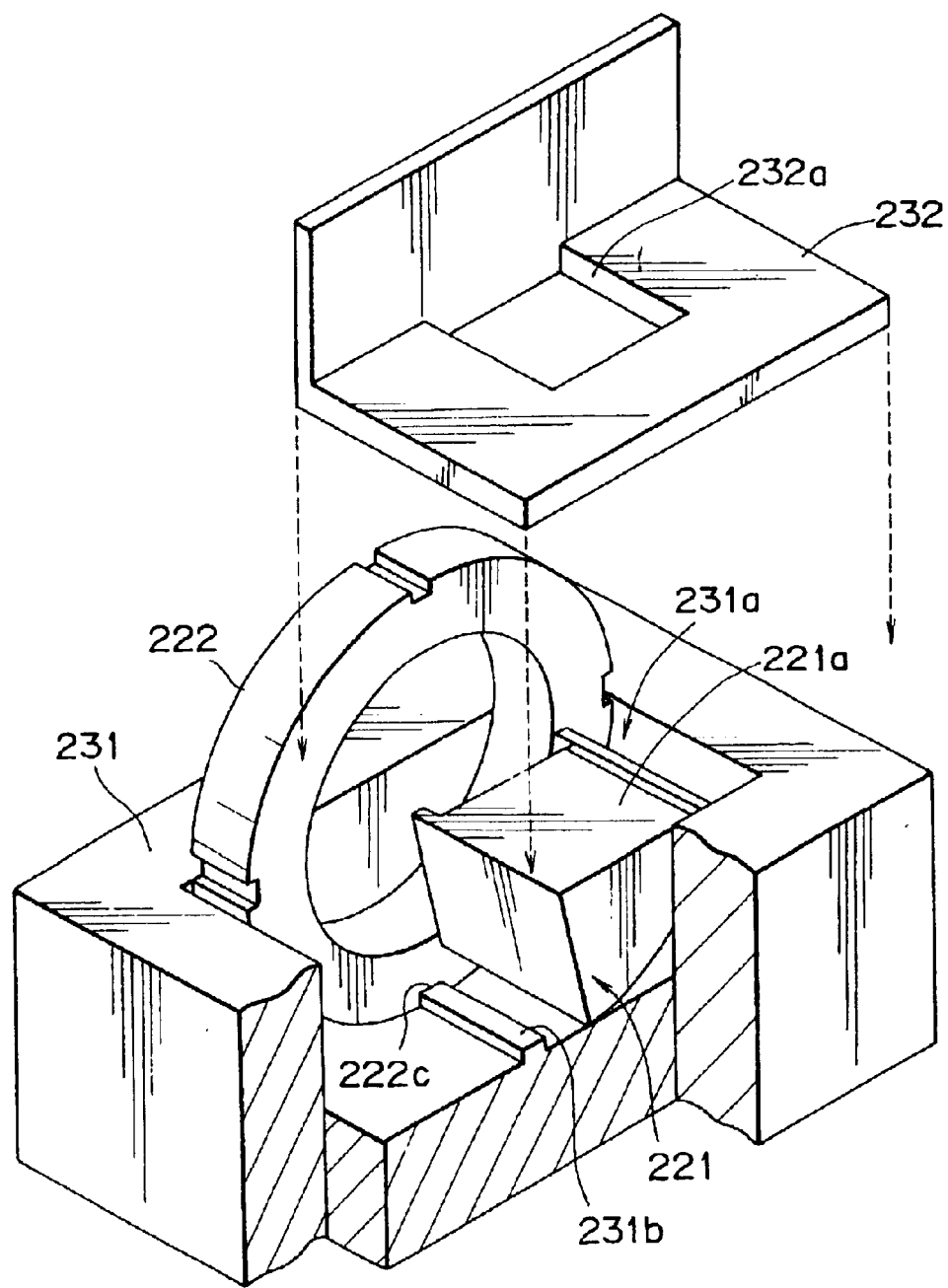
FIG. 22 is a perspective view showing one step of fabricating the semiconductor light emitting device shown in FIG. 18.

After that, a conductive mounting board 221 and a support 222 are integrally cast, and a thin film made from nickel is formed on the surfaces of the conductive mounting board 221 and the support 222 by plating. Next, as shown in FIG. 22, the support 222 and the conductive mounting board 221 are inserted in a mounting hole 231a of a holding jig 231 with the mounting surface 221a directed upwardly. In this case, the fixing groove 222c of the support 222 is fitted around a fixing projection 231b of the holding jig 231, so that the support 222 and the conductive mounting board 221 are fixed on the holding jig 231. A mold 232 having an opening 232a corresponding to the mounting surface 221a is placed on the conductive mounting board 221, and a solder film made from tin is vapor-deposited on the mounting surface 221a by a resistance heating type vapor-deposition apparatus.

Figure 23:
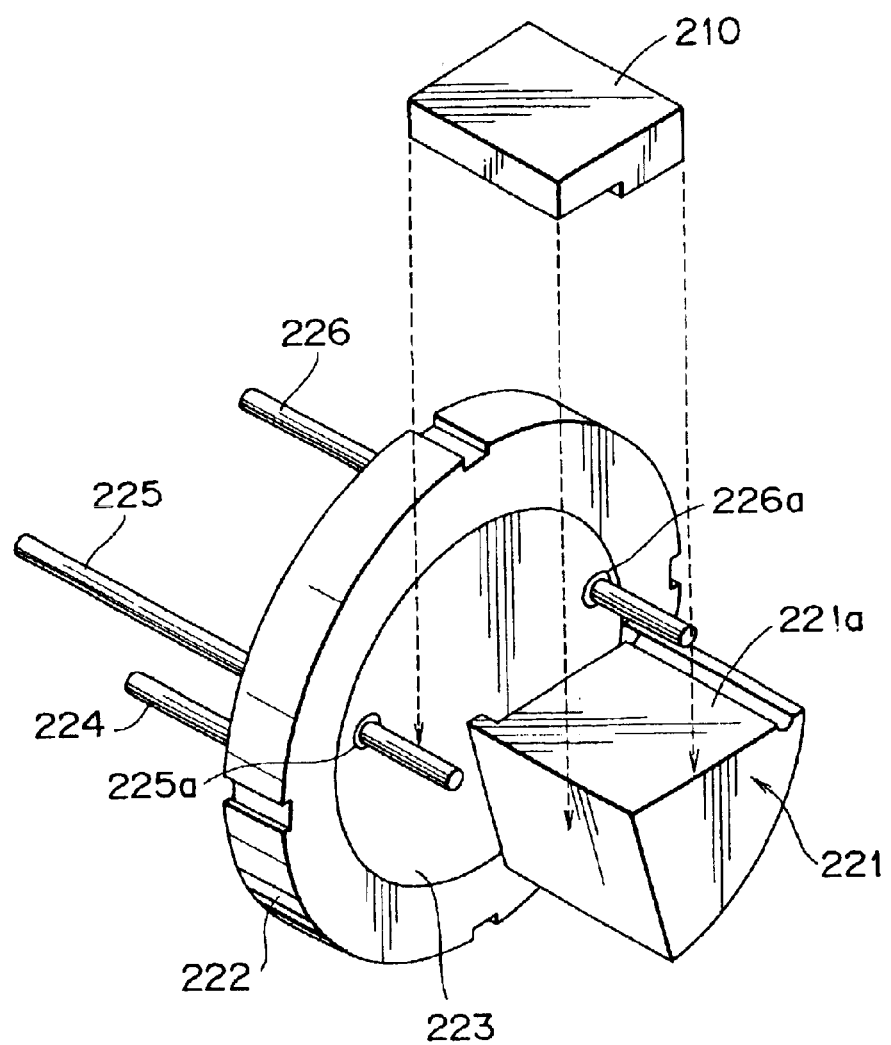
FIG. 23 is a perspective view showing a fabricating step subsequent to that shown in FIG. 22.

On the other hand, a disk member 223 and a pin 224 are integrally cast, and pins 225 and 226 are prepared. The pins 225 and 226 are mounted to the disk member 223 via insulating rings 225a and 226a, respectively. As shown in FIG. 23, the disk member 223 thus prepared is mounted to the support 222. The semiconductor laser 210 is then disposed such that the n-side electrode 218a projects from the conductive mounting board 221 in the direction parallel to the mounting surface 221a and the supporting surface 222a and the p-side electrode 218c and the insulating layer 218b are in contact with the mounting surface 221a. That is to say, of the n-side electrode 218a and the p-side electrode 218c, only the p-side electrode 218c is, together with the insulating layer 218b, brought into contact with the mounting surface 221a.

The assembly thus prepared is then heated for 10 to 30 sec at a temperature of 235° C. or more to melt the solder film, whereby the p-side electrode 218c and the insulating layer 218b are fixed on the conductive mounting board 221 by soldering. The heating for soldering is preferably performed in an atmosphere containing nitrogen gas, hydrogen gas ($H_2$), or a mixed gas thereof for preventing oxidation of the solder material. For example, in the case using tin as the solder material, it may be desirable to use a mixed gas containing nitrogen gas and hydrogen gas at a mixing ratio of $N_2:H_2=16:1$. Also it may be desirable to usually keep the flow state of the mixed gas. Further, the semiconductor laser 210 is preferably pushed down, for example, by applying a load thereon for preventing the positional offset of the semiconductor laser 210 due to the surface tension of the molten solder material.

Figure 24:
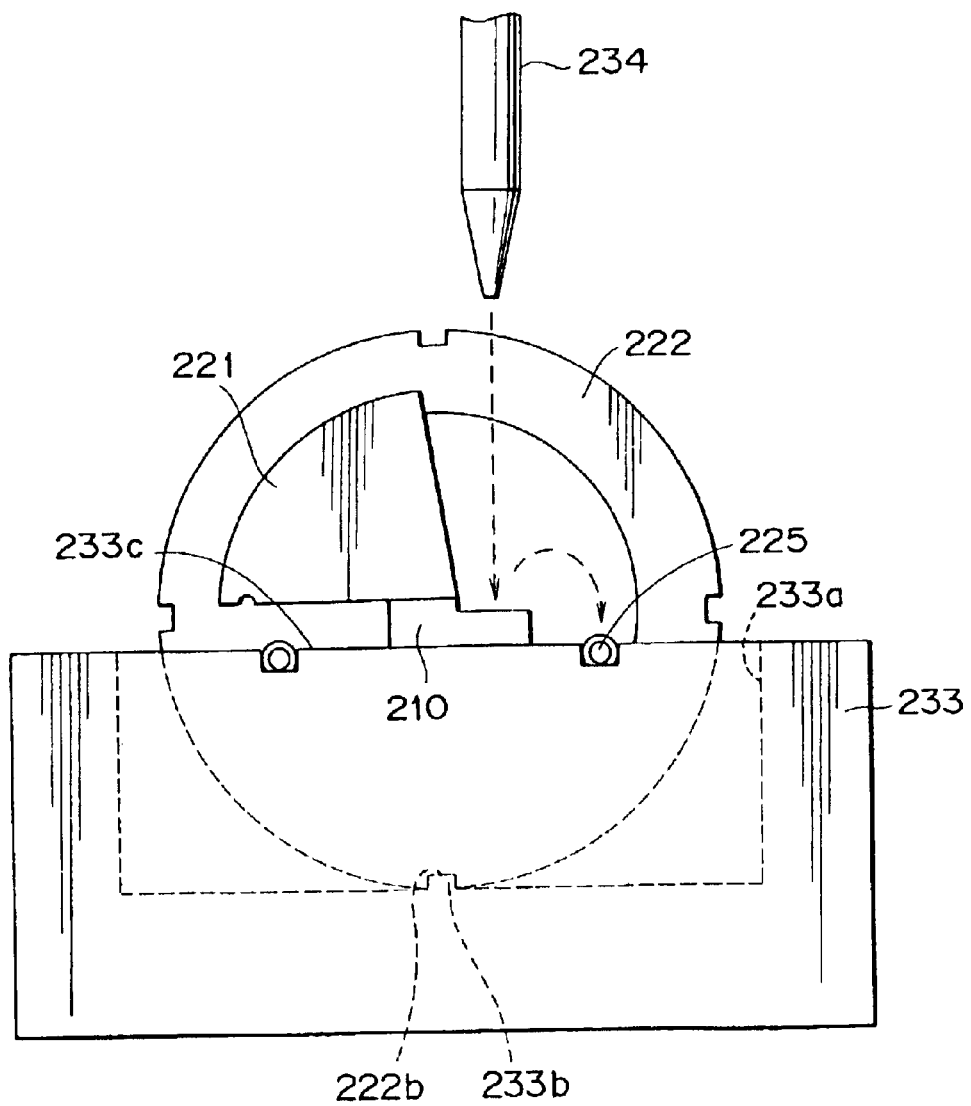
FIG. 24 is a perspective view showing a fabricating step subsequent to that shown in FIG. 23.

After the semiconductor laser 210 is mounted on the conductive mounting board 221, as shown in FIG. 24, the support 222 is inserted in a mounting hole 233a of a holding jig 233 with the mounting surface 221a directed downwardly. That is to say, the semiconductor laser 210 is positioned on the lower side and the conductive mounting board 221 is positioned on the upper side. At this time, the fixing groove 222b of the support 222 is fitted around a fixing projection 233b of the holding jig 233, so that the support 222 is fixed on the holding jig 233. At this time, the substrate 211 side of the semiconductor laser 210 is supported by an upper surface 233c of the holding jig 233.

The support 211 is heated at 100° C., and the n-side electrode 218a of the semiconductor laser 210 is connected to the pin 225 with a wire 227 by using a capillary 234. In this embodiment, the side surface 221b of the conductive mounting board 221 is tilted, from the mounting surface 221a side to the opposed side, toward the opposed end of the mounting surface 221a, and accordingly a space near the n-side electrode 218a is broadened, so that the capillary 234 can be easily moved closer to the n-side electrode 218a. After connection of the wire 227, a cover body 228 separately formed is mounted to the support 222 in a dry nitrogen atmosphere. In this way, the semiconductor light emitting device shown in FIG. 18 is obtained.

The functions of the semiconductor light emitting device thus obtained will be described below.

In the semiconductor light emitting device, when a specific voltage is applied between the n-side electrode 218a and the p-side electrode 218c of the semiconductor laser 210 via the pins 225 and 224 of the package 220, a current is injected in the active layer 216 to cause light emission by recombination of electrons with positive holes. The light is reciprocated between the pair of reflector films 219 to be amplified, and is emitted from one reflector film 219 as a laser beam. The laser beam thus emitted from the semiconductor laser 210 is extracted outwardly from the package 220 via the extraction window 228a of the package 220.

At this time, in the semiconductor laser 210, heat generation occurs mainly at the active layer 216. In this embodiment, since the p-side electrode 218c is directly connected to the conductive mounting board 221 to shorten the distance between the active layer 216 and the conductive mounting board 221, heat generated in the active layer 216 is positively radiated via the conductive mounting board 221. As a result, the temperature rise of the semiconductor laser 210 is suppressed, so that the semiconductor laser 210 can stably operate for a long-period of time.

Further, in this embodiment, since the p-side electrode 218c of the semiconductor laser 210 is fixed to the conductive mounting board 221 and the n-side electrode 218a of the semiconductor laser 210 projects from the conductive mounting board 221, it is possible to prevent short-circuit between the n-side electrode 218a and the p-side electrode 218c.

In this way, according to the semiconductor light emitting device in this embodiment, since the p-side electrode 218c is fixed to the conductive mounting board 221 and the n-side electrode 218a projects from the conductive mounting board 221, it is possible to prevent short-circuit between the n-side electrode 218a and the p-side electrode 218c and to positively radiate heat generated in the semiconductor laser 210 via the conductive mounting board 221. Accordingly, it is possible to suppress temperature rise of the semiconductor laser 210 and keep a stable operational state of the device for a long-period of time, and hence to improve the reliability of the device.

In particular, since the p-side electrode 218c is fixed to the conductive mounting board 221, it is possible to shorten the distance between the active layer 216 and the conductive mounting board 221, and hence to effectively radiate heat generated in the active layer 216.

Since the side surface 221b of the conductive mounting board 221 is tilted, from the mounting surface 221a side to the opposed side, toward the p-side electrode 218c side, it is possible to broaden a space near the n-side electrode 218a and hence to facilitate the connection of the wire to the n-side electrode 218a. This makes it possible to facilitate the electrical connection of the n-side electrode 218a to a power source.

Since the conductive mounting board 221 is located in such a manner as to be shifted rightwardly from the center of the supporting surface 222a with the mounting surface 221a directed upwardly, it is possible to easily fix the p-side electrode 218c to the conductive mounting board 221 in the state in which the n-side electrode 218a projects from the conductive mounting board 221 in the direction parallel to the mounting surface 221a and the supporting surface 222a, and to locate the semiconductor laser 210 at the central portion of the support 222.

Since the support 222 has the fixing groove 222b for fixing the conductive mounting board 221 with the mounting surface 221a directed downwardly, it is possible to fix the n-side electrode 218a and the pin 225 on the holding jig 233 upon connection of the wire 227 between the n-side electrode 218a and the pin 225. Accordingly, it is possible to facilitate the work for connecting the wire 227 and hence to facilitate the electrical connection of the n-side electrode 218a to a power source According to the method of fabricating a semiconductor light emitting device in this embodiment, since the semiconductor laser 210 is formed and then the p-side electrode 218c is fixed to the conductive mounting board 221 in the state in which the n-side electrode 218a projects from the conductive mounting board 221, it is possible to easily fabricate the semiconductor light emitting device in this embodiment. Further, since the semiconductor laser 210 is located on the lower side and the conductive mounting board 221 is located on the upper side and in such a state the n-side electrode 218a is connected to the pin 224 by means of the wire 227, it is possible to facilitate the connection of the wire 227, and hence to facilitate the electrical connection of the n-side electrode 218a to a power source.

To confirm the heat radiation effect of the semiconductor light emitting device in this embodiment, the following comparative experiment was performed. First, a semiconductor light emitting device according to this embodiment shown in FIG. 18 was prepared, and a semiconductor light emitting device shown in FIG. 25 was prepared as a comparative example. In this comparative example, the same semiconductor laser 210 as that described in this embodiment was mounted on a conductive mounting board 2221 via a sub-mount 2229 made from aluminum nitride (AlN). A p-side electrode 218c was connected to a wiring portion 2229a disposed on the sub-mount 2229 and the wiring portion 2229a was connected to the conductive mounting board 2221 via a wire 2227a. An n-side electrode 218a was connected to a wiring portion 2229b disposed on the sub-mount 2229 and the wiring portion 2229b was connected to a pin 2225 via a wire 2227b.

Each semiconductor light emitting device was put in a thermostat (not shown) kept at a temperature 20° C. and driven. In this drive state, the temperature changes of the semiconductor lasers 210 and the conductive mounting boards 221 and 2221 were observed. In addition, a direct current of 300 mA was allowed to flow in each semiconductor laser 210. At this time, the operational voltage of each semiconductor laser 210 was about 8 V. The temperature was measured by using thermocouples attached to the substrate 211 and the conductive mounting board 221 (or 2221) of each semiconductor laser 210.

As a result, it was revealed that the temperature of each semiconductor light emitting device became stable after an elapse of about 10 sec since application of the voltage. In the semiconductor light emitting device in this embodiment, the temperature of the semiconductor laser 210 was 30° C. and the temperature of the conductive mounting board 221 was 24° C. That is to say, the temperature of the semiconductor laser 210 was raised by 10° C. and the temperature of the conductive mounting board 221 was raised by 4° C. On the contrary, in the semiconductor light emitting device in the comparative example, the temperature of the semiconductor laser 210 was 35° C. and the temperature of the conductive mounting board 2221 was 25° C. That is to say, the temperature of the semiconductor laser 210 was raised by 15° C. and the temperature of the conductive mounting board 2221 was raised by 5° C. As a result, it was revealed that the semiconductor light emitting device in this embodiment exhibited a high heat radiation effect capable of effectively suppressing temperature rise of the semiconductor laser 210.

While the embodiment of the present invention has been described, the present invention is not limited thereto, and it is to be understood that various changes may be made with departing from the spirit, or scope of the present invention. For example, although the entire side surface 221b of the conductive mounting board 221 is tilted in the embodiment, only a portion of the side surface 221b may be tilted.

In the embodiment, the conductive mounting board 221 is located in such a manner as to be shifted rightwardly from the center of the supporting surface 222a when the mounting surface 221a is directed upwardly, however, it may be located in such a manner as to be shifted leftwardly. That is to say, the conductive mounting board 221 may be shifted rightwardly or leftwardly so that one of the n-side electrode 218a and the p-side electrode 218c can be fixed thereto. However, in the case where the n-side electrode 218a or the p-side electrode 218c is connected to the pin 225 in accordance with Japanese Industrial Standards, it may be desirable to shift the conductive mounting board 221 on the right side opposed to the pin 225 for facilitating the connection of the wire between the electrode and the pin 225.

In the embodiment, the conductive mounting board 221 is made from a metal, however, it may be made from a conductive material other than a metal.

In the embodiment, the p-side electrode 218c is fixed to the conductive mounting board 221 and the n-side electrode 218a projects from the conductive mounting board 221, however, the n-side electrode 218a may be fixed to the conductive mounting board 221 and the p-side electrode may project from the conductive mounting board 221.

In the embodiment, the first conduction type semiconductor layer is taken as the n-type semiconductor layer 215 and the second conduction type semiconductor layer is taken as the p-type semiconductor layer 217, however, the first conduction type semiconductor layer may be taken as a p-type semiconductor layer and the second conduction type semiconductor layer may be taken as an n-type semiconductor layer. However, in the case where the crystallinity of the n-type semiconductor layer is superior to that of the p-type semiconductor layer, for example, in the case of a compound semiconductor composed of a nitride containing nitrogen and a group III element, it may be desirable that an n-type semiconductor layer, an active layer, and a p-type semiconductor layer sequentially grow on a substrate, in order to obtain a desirable semiconductor light emitting element.

In the embodiment, the compound semiconductor composed of the group III based nitride for forming each of the n-type semiconductor layer 215, the active layer 216, the p-type semiconductor layer 217, and the like of the semiconductor laser 210 is exemplarily described, however, according to the present invention, it may be replaced with a suitable compound semiconductor composed of a different group III based nitride containing nitrogen (N) and at least one kind of group III element selected from the group consisting of gallium (Ga), aluminum (Al), boron (B) and indium (In).

Further, in the embodiment, each of the n-type semiconductor layer 215, the active layer 216, the p-type semiconductor layer 217, and the like of the semiconductor laser 210 is made from the compound semiconductor composed of the group III based nitride, however, according to the present invention, the above layer may be made from a different semiconductor. However, it should be noted that as described in the embodiment, the present invention is particularly effective to a semiconductor light emitting device in which a semiconductor element is configured such that the first electrode and the second electrode are positioned on the same side in the stacking direction.

In the embodiment, the configuration of the semiconductor laser 210 is exemplarily described, however, the present invention is not limited thereto. For example, the semiconductor laser of the present invention may be configured such that the deterioration preventive layer 217a is not provided; each of the first guide layer 215c and the second guide layer 217b is made from an undoped semiconductor; or the current constriction is performed in a manner different from that described in the embodiment.

In the embodiment, the semiconductor device is configured as a semiconductor light emitting device including a semiconductor laser 210, however, the present invention is applicable to a semiconductor light emitting device including a different semiconductor light emitting element such as a light emitting diode, and also applicable to a semiconductor device including a semiconductor element other than the semiconductor light emitting device.

Additionally, in the embodiment, each of the first conduction type semiconductor layer 215, the active layer 216, the second conduction type semiconductor layer 217, and the like of the semiconductor laser 210 is formed by MOCVD, however, it may be formed by a different vapor-phase growth process such as an MBE process or a halide vapor-phase growth process, also called a hydride vapor-phase growth process, in which halogen contributes to transportation or reaction of a raw material.

What is claimed is:

1. A semiconductor device comprising:
   a semiconductor laser having a plurality of stacked semiconductor layers and also having a first electrode and a second electrode provided on the same side in the stacking direction; and
   a conductive mounting board for supporting said semiconductor laser in a state in which one of said first electrode and said second electrode of said semiconductor laser is fixed to said conductive mounting board.

2. A semiconductor device according to claim 1, wherein said semiconductor laser has, as the semiconductor layers, a first conduction type semiconductor layer, an active layer, and a second conduction type semiconductor layer which are sequentially stacked, and
   said first electrode is provided on a portion, on the side where said second conduction type semiconductor layer is provided, of said first conduction type semiconductor layer, and said second electrode is provided on a portion, on the side opposed to said first conduction type semiconductor layer, of said second conduction type semiconductor layer, said second electrode being fixed on said conductive mounting board.

3. A semiconductor device according to claim 2, wherein said first conduction type semiconductor layer is an n-type semiconductor layer and said second conduction type semiconductor layer is a p-type semiconductor layer; and
   said first electrode is an n-side electrode and said second electrode is a p-side electrode.

4. A semiconductor device according to claim 2, wherein each of said first conduction type semiconductor layer, said active layer, and said second conduction type semiconductor layer is made from a compound semiconductor composed of a nitride containing nitrogen (N) and at least one kind of group III element selected from a group consisting of gallium (Ga), aluminum (Al), boron (B) and indium (In).

5. A semiconductor device according to claim 1, wherein said conductive mounting board has a mounting surface on which said semiconductor laser is to be disposed; and
   said semiconductor laser is disposed on said conductive mounting board in such a manner that either said first electrode or said second electrode is fixed on said mounting surface of said conductive mounting board, and the other electrode projects from said conductive mounting board in the direction parallel to said mounting surface.

6. A semiconductor device according to claim 5, wherein said conductive mounting board has a side surface on the side where the other of said first electrode and said second electrode of said semiconductor laser projects; and
   said side surface is tilted, from said mounting surface side to the opposed side, toward one of said first electrode and said second electrode.

7. A semiconductor device according to claim 1, further comprising a pin electrically insulated from said conductive mounting board;
   wherein the other of said first electrode and said second electrode of said semiconductor laser is electrically connected to said pin via a wire.

8. A semiconductor device according to claim 1, further comprising a support having a supporting surface on which said conductive mounting board is to be supported;
   wherein said conductive mounting board has a mounting surface on which said semiconductor laser is to be disposed, said mounting surface being perpendicular to said supporting surface; and
   said conductive mounting board is located in such a manner as to be shifted rightwardly from the center of the supporting surface when said mounting surface is directed upwardly.

9. A semiconductor device according to claim 1, further comprising a support having a supporting surface on which said conductive mounting board is to be supported;

wherein said conductive mounting board has a mounting surface on which said semiconductor element is to be disposed, said mounting surface being perpendicular to said supporting surface; and said support has a fixing groove for fixing said conductive mounting board with said mounting surface directly downwardly.

10. A package comprising:

a conductive mounting board having a mounting surface on which a semiconductor element is to be disposed; and a support, having a supporting surface perpendicular to said mounting surface, for supporting said conductive mounting board by said supporting surface, wherein said conductive mounting board is located in such a manner as to be shifted rightwardly or leftwardly from the center of said supporting surface when said mounting surface is directed upwardly; and said conductive mounting board has a side surface at an end, towards the center of said support, in the direction parallel to said mounting surface and said supporting surface, and said side surface is tilted, from said mounting surface side to the opposed side, along the opposed end of said mounting surface.

11. A package according to claim 10, wherein said conductive mounting board is located to be shifted rightwardly from the center of said supporting surface when said mounting surface is directed upwardly.

12. A package according to claim 10, wherein said support has a fixing groove for fixing said conductive mounting board with said mounting surface directed downwardly.

* * * * *